(12) United States Patent
Sato et al.

(10) Patent No.: US 11,770,630 B2
(45) Date of Patent: Sep. 26, 2023

(54) PHOTOELECTRIC CONVERSION APPARATUS, PHOTOELECTRIC CONVERSION SYSTEM, AND MOBILE BODY

(71) Applicant: CANON KABUSHIKI KAISHA, Tokyo (JP)

(72) Inventors: Masaki Sato, Kanagawa (JP); Masahiro Kobayashi, Tokyo (JP); Tatsuya Ryoki, Kanagawa (JP); Kohichi Nakamura, Kanagawa (JP); Daisuke Kobayashi, Saitama (JP); Hiroaki Kameyama, Kanagawa (JP); Yasuhiro Oguro, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 41 days.

(21) Appl. No.: 17/590,634

(22) Filed: Feb. 1, 2022

(65) Prior Publication Data

US 2022/0247948 A1  Aug. 4, 2022

(30) Foreign Application Priority Data

Feb. 4, 2021  (JP) ................. 2021-016450

(51) Int. Cl.
*H04N 25/672* (2023.01)
*H01L 27/146* (2006.01)

(52) U.S. Cl.
CPC ..... *H04N 25/672* (2023.01); *H01L 27/14623* (2013.01)

(58) Field of Classification Search
None
See application file for complete search history.

(56) References Cited

U.S. PATENT DOCUMENTS

| | | | | |
|---|---|---|---|---|
| 8,072,519 | B2* | 12/2011 | Noda | H04N 25/531 |
| | | | | 348/308 |
| 8,792,034 | B2* | 7/2014 | Takahashi | H04N 25/53 |
| | | | | 348/297 |
| 9,432,603 | B2* | 8/2016 | Ishii | H04N 25/63 |
| 10,015,427 | B2* | 7/2018 | Nakajima | H04N 25/76 |
| 10,873,712 | B2* | 12/2020 | Yasuma | H04N 23/60 |
| 11,388,358 | B2* | 7/2022 | Kobayashi | H04N 25/63 |
| 2004/0095495 | A1* | 5/2004 | Inokuma | H04N 23/54 |
| | | | | 348/308 |
| 2006/0007504 | A1* | 1/2006 | Inaba | H04N 25/677 |
| | | | | 358/463 |

(Continued)

FOREIGN PATENT DOCUMENTS

JP  2017183658 A  10/2017
JP  2020025263 A  2/2020

(Continued)

*Primary Examiner* — Cynthia Segura
(74) *Attorney, Agent, or Firm* — Canon U.S.A., Inc. I.P. Division

(57) ABSTRACT

A photoelectric conversion apparatus includes a second substrate including a signal processing circuit configured to perform signal processing using machine learning on a signal output from the first substrate. The second substrate is disposed on the first substrate in a multilayer structure. The signal processing circuit is so disposed to overlap with a pixel array but not overlap with a light-shielded pixel area as seen in a plan view.

19 Claims, 14 Drawing Sheets

(56) References Cited

U.S. PATENT DOCUMENTS

| | | | |
|---|---|---|---|
| 2009/0109312 A1* | 4/2009 | Noda | H04N 25/44 |
| | | | 348/304 |
| 2010/0085448 A1* | 4/2010 | Fukuoka | H04N 25/68 |
| | | | 348/E5.079 |
| 2019/0104260 A1 | 4/2019 | Izuhara | |
| 2019/0104272 A1* | 4/2019 | Izuhara | H04N 25/745 |
| 2019/0215473 A1 | 7/2019 | Miyatani | |
| 2020/0412982 A1 | 12/2020 | Haneda | |
| 2021/0168318 A1* | 6/2021 | Eki | H04N 25/709 |
| 2021/0385403 A1* | 12/2021 | Eki | H01L 27/14634 |
| 2022/0247966 A1* | 8/2022 | Ochiai | H04N 25/772 |

FOREIGN PATENT DOCUMENTS

| | | |
|---|---|---|
| JP | 2021005846 A | 1/2021 |
| WO | 2017169878 A1 | 10/2017 |
| WO | 2018012492 A1 | 1/2018 |

* cited by examiner

FIG. 13B
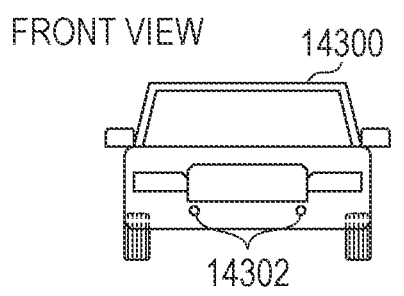
FRONT VIEW 14300
14302
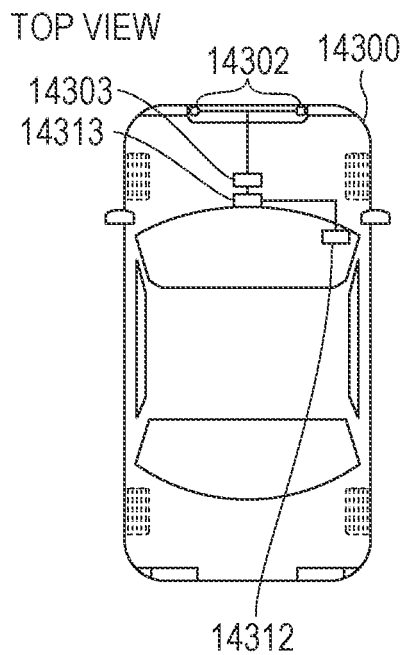
TOP VIEW
14302 14300
14303
14313
14312
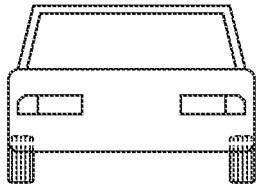
REAR VIEW

PHOTOELECTRIC CONVERSION APPARATUS, PHOTOELECTRIC CONVERSION SYSTEM, AND MOBILE BODY

BACKGROUND

Field of the Disclosure

The present disclosure relates to a photoelectric conversion apparatus, a photoelectric conversion system, and a mobile body.

Description of the Related Art

In a photoelectric conversion apparatus that converts incident light into electric charges, it is known to configure the photoelectric conversion apparatus in a multilayer structure in which a plurality of substrates are disposed one on another.

Japanese Patent Laid-Open No. 2020-25263 discloses a multilayer light receiving sensor in which a first substrate including pixels and a second substrate including a signal processing circuit (DSP) are disposed one on another.

SUMMARY

In an aspect, the present disclosure provides a photoelectric conversion apparatus including a first substrate including a pixel array, the pixel array including an effective pixel area and a light-shielded pixel area, the effective pixel area including a plurality of effective pixels on which light is incident, the light-shielded pixel area including a plurality of light-shielded pixels on which no light is incident, a second substrate including a signal processing circuit configured to perform signal processing using machine learning on a signal output from the first substrate, the second substrate being disposed on the first substrate in a multilayer structure, the signal processing circuit being so disposed to overlap with the pixel array but not overlap with the light-shielded pixel area as seen in a plan view.

Further features of the present invention will become apparent from the following description of exemplary embodiments with reference to the attached drawings.

BRIEF DESCRIPTION OF THE DRAWINGS

FIG. 13B is a diagram illustrating an example of a mobile body.

DESCRIPTION OF THE EMBODIMENTS

In the light receiving sensor disclosed in Japanese Patent Laid-Open No. 2020-25263, in order to reduce the influence of noise, generated by the signal processing circuit disposed on the second substrate, on the pixels, the signal processing circuit and the pixel array are disposed so as not to overlap at all. However, this configuration may cause an increase in the chip size of the photoelectric conversion apparatus.

Furthermore, in order to reduce the influence of heat and noise generated by the signal processing circuit on the pixels, the signal processing circuit and the pixel array may be disposed so that they do not overlap at all, but this may cause an increase in the chip size of the photoelectric conversion apparatus.

In view of the above, the present disclosure provides a technique of reducing the influence of heat and noise generated by a signal processing circuit on pixels while suppressing an increase in the chip size of a photoelectric conversion apparatus.

In embodiments described below, an imaging apparatus will be mainly described as an example of the photoelectric conversion apparatus. However, the embodiments are not limited to the imaging apparatus, and can be applied to other wide variety of photoelectric conversion apparatuses. For example, the embodiments are applicable to a distance measurement apparatus (an apparatus for measuring a distance using focus detection and TOF (Time Of Flight)), a photometric apparatus (an apparatus for measuring the amount of incident light, etc.), and the like.

Note that the conductivity types of transistors described in the following embodiments are merely examples, and the conductivity types are limited to those described in the embodiments. The conductivity types may be appropriately changed from those described in the embodiments, and potentials at gates, sources, and drains of transistors may be appropriately changed according to the changes of the conductivity types.

For example, for a transistor that operates as a switch, the low level and the high level of the voltages supplied to the gate of the transistor may be reversed from those with described in the embodiments when the conductivity type is changed. Furthermore, the conductivity types of semiconductor regions described in the embodiments are also merely examples, and the conductivity types are not limited to those described in the embodiments. The conductivity types may be appropriately changed from those described in the embodiments, and the potentials of the semiconductor regions may be appropriately changed according to the changes of the conductivity types.

First Embodiment

Figure 1:
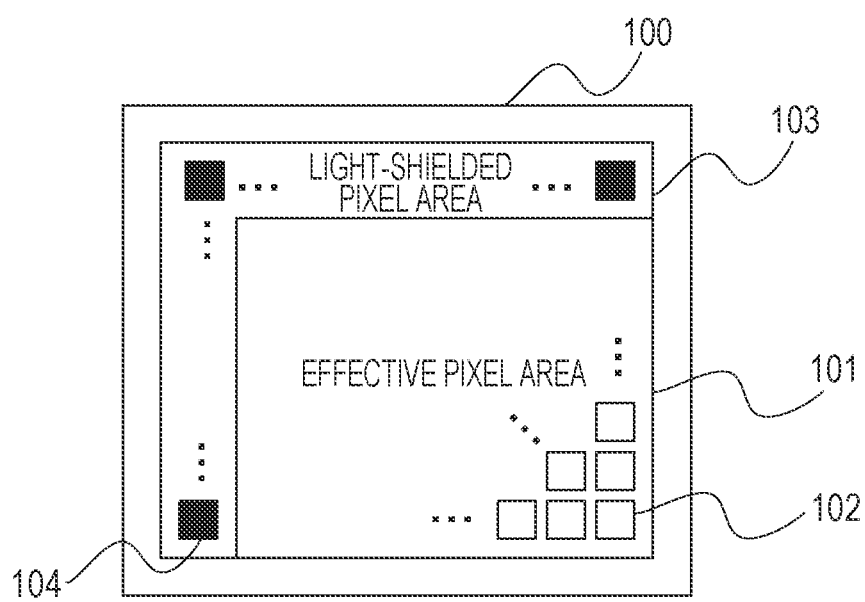
FIG. 1 is a diagram showing an example of a configuration of a first substrate.

FIG. 1 is a diagram showing a configuration of a first substrate (a pixel substrate) included in a photoelectric conversion apparatus according to a first embodiment.

The first substrate 100 has an effective pixel area 101 in which effective pixels 102 are arranged over a plurality of rows and a plurality of columns. In the case of a general digital camera, tens of millions of effective pixels 102 are arranged in the pixel array 101. A light-shielded pixel area 103 in which light-shielded pixels 104 are arranged is provided in a peripheral area adjacent to the effective pixel area 101. In the example shown in FIG. 1, the light-shielded pixel area 103 includes an area A in which light-shielded pixels 104 are arranged in one row and one column and an area B in which light-shielded pixels 104 are arranged in a plurality of rows and one column. However, the arrangements of the area A and the area B are not limited these examples. For example, in the area A, light-shielded pixels 104 may be arranged in a plurality of rows and a plurality of columns, and/or light-shielded pixels 104 may be arranged in a plurality of rows and a plurality of columns in the area B. The pixel array provided on the first substrate 100 includes an effective pixel area 101 and a light-shielded pixel area 103.

The light-shielded pixels 104 include an optical black pixel that outputs a black-level signal. The optical black pixel includes a light-shielded photoelectric conversion element.

The first substrate 100 has connection parts 120-1 and 120-2 via which to output signals to the second substrate described later. The connection parts 120-1 and 120-2 typically include a TSV (Through Silicon Via) structure.

Figure 2A:
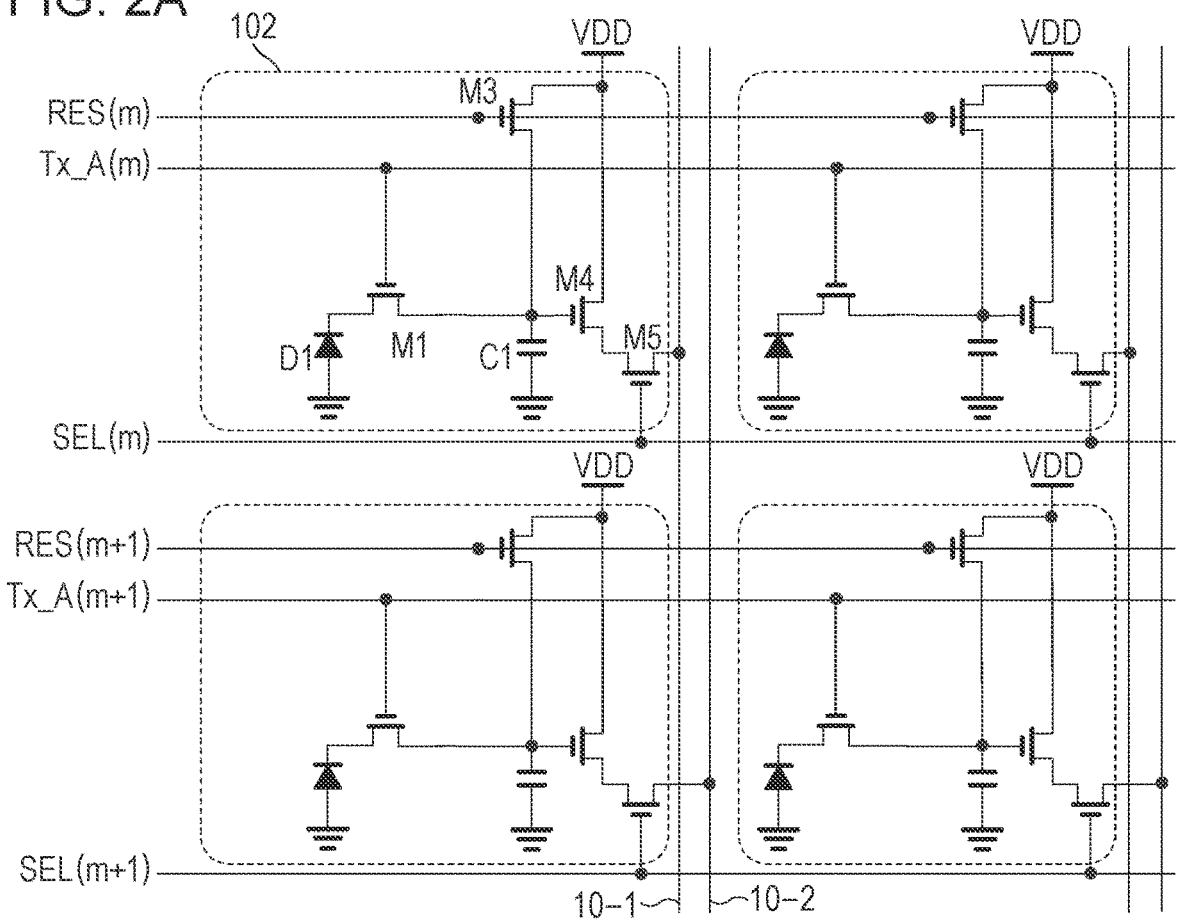
FIGS. 2A and 2B each are a diagram showing an example of a pixel configuration.

FIG. 2A is a circuit diagram showing a circuit of 2×2 effective pixels 102 of the effective pixels 102 shown in FIG. 1. In the following description, it is assumed that electric charges accumulated in a photodiode, which is a photoelectric conversion element, are electrons. It is also assumed that all the transistors included in each effective pixel 102 are N-type transistors. However, electric charges accumulated in each photodiode may be holes. In this case, transistors included in each effective pixel 102 may be P-type transistors. That is, the conductivity type specified in the following description may be changed according to the polarity of the charges of signals.

Each effective pixel 102 includes a photodiode D1 which is a photoelectric conversion element, a transfer transistor M1, a charge conversion element C1, a reset transistor M3, an amplification transistor M4, and a selection transistor M5. The transfer transistor M1 is provided in the electrical path between the node to which the charge conversion element C1, the reset transistor M3, and the amplification transistor M4 are connected, and the photodiode D1. The charge conversion element C1 is also called a floating diffusion part (FD part). A power supply voltage VDD is applied to the reset transistor M3 and the amplification transistor M4. The selection transistor M5 is disposed in an electrical path between the amplification transistor M4 and a column signal line 10. That is, the amplification transistor M4 is electrically connected to the vertical output line 10 via the selection transistor M5. The charge conversion element C1 includes stray diffusion capacitance provided in the semiconductor substrate and parasitic capacitance, coupled via the stray diffusion capacitance, occurring along an electric path from the transfer transistor M1 to the amplification transistor M5.

A signal RES, a signal Tx_A, and a signal SEL are supplied from a vertical scanning circuit (not shown in FIG. 1) via control lines 30. In FIG. 2, each signal is denoted by a signal name with a pixel line number via which the signal is supplied. More specifically, for example, a signal RES supplied to pixels in an m-th row is denoted by a signal RES(m).

A current source (not shown) is connected to each of the vertical output lines 10-1 and 10-2. When the signal SEL(m) transitions to an active level, the selection transistors M5 of the effective pixels 102 in the m-th row turn on. As a result, a current is supplied from the current source to the amplification transistor M4 of each effective pixel 102 in the m-th row. In the effective pixel 102 in the m-th row, a source follower circuit is formed by the power supply voltage VDD, the amplification transistor M4, and the current source (not shown) connected to the vertical output line 10-1. As a result of forming this source follower circuit, the amplification transistor M4 outputs a signal based on the potential of the charge conversion element C1 to the vertical output line 10-1 via the transistor M5.

When the signal SEL(m+1) transitions to the active level, the selection transistor M5 of each effective pixel 102 in the (m+1)-th line turns on. As a result, a current is supplied from the current source to the amplification transistor M4 of each effective pixel 102 in the (m+1)-th row. In the effective pixel 102 in the (m+1)-th row, a source follower circuit is formed by the power supply voltage VDD, the amplification transistor M4, and the current source (not shown) connected to the vertical output line 10-2. As a result of forming this source follower circuit, the amplification transistor M4 outputs a signal based on the potential of the charge conversion element C1 to the vertical output line 10-2 via the transistor M5.

As described above, the effective pixel 102 in the m-th row and the effective pixel 102 in the (m+1)-th row are connected to different vertical output lines 10.

Figure 2B:
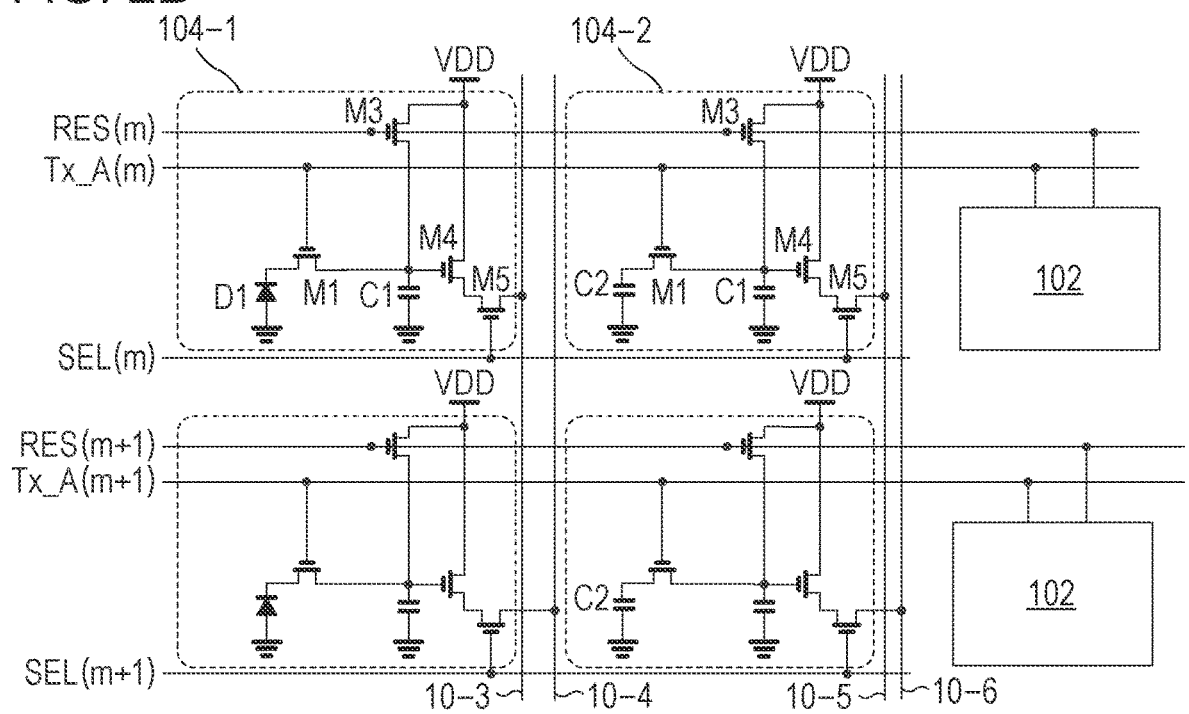

FIG. 2B shows a configuration of an optical black pixel 104-1 and a reference pixel 104-2 wherein the optical black pixel 104-1 is a part of the light-shielded pixel 104 and the reference pixel 104-2 is another part of the light-shielded pixel 104. The optical black pixel 104-1 has the same configuration as the configuration of the effective pixel 102 except that the photodiode D1 is shielded from light. The optical black pixel 104-1 functions as a pixel that outputs a black-level signal.

The reference pixel 104-2 is configured such that it does not include the photodiode D1 functioning as a photoelectric conversion element. The reference pixel 104-2 includes a capacitance element C2 instead of the photodiode D1. The configuration of the reference pixel 104-2 is not limited to this example. For example, the capacitance element C2 may not be provided, or the transfer transistor M1 may not be provided. When viewed from the center of the pixel array, the effective pixels 102, the reference pixel 104-2, and the optical black pixel 104-1 are arranged in this order. In other words, the reference pixel 104-2 is disposed between the effective pixel 102 and the optical black pixel 104-1. The reference pixel 104-2 outputs a signal corresponding to a reset level of the capacitance element C1 realized by the FD part to a corresponding vertical output line 10-$n$ ($n$ is a natural number). The signal output by the reference pixel 104-2 can be used as a signal for being referring to in detecting a noise component of the amplification transistor M4.

Part of the vertical output lines 10-$n$ are connected to the connection part 120-1, and the other vertical output lines 10-$n$ are connected to the connection part 120-2.

Figure 3:
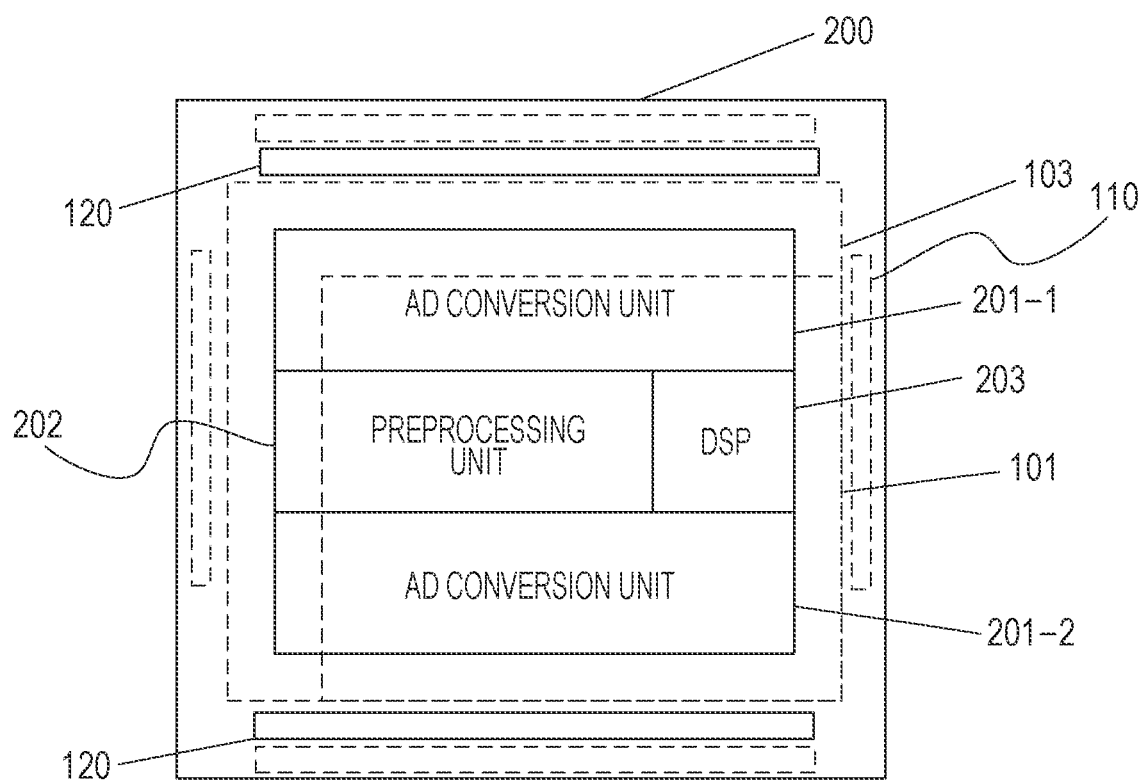
FIG. 3 is a diagram showing an example of a configuration of a second substrate.

FIG. 3 illustrates a configuration of the second substrate 200 disposed on the first substrate 100 in a multilayer structure. In FIG. 3, broken lines represent the effective pixel area 101, the light-shielded pixel area 103, and bypass capacitors 110 provided on the first substrate 100. One end of each bypass capacitor 110 receives a power supply voltage supplied to the pixel array and the other end thereof receives another power supply voltage supplied to the pixel array. That is, one electrode of the bypass capacitor 110 is connected to a power supply line that supplies a first power supply voltage, and the other electrode is connected to another power supply line that supplies a second power supply voltage. This stabilizes the plurality of power supply voltages supplied to the pixel array. Two typical examples of these plurality of power supply voltages are the power supply voltage VDD shown in FIG. 2 and the ground voltage supplied to the photodiode D1. AD conversion units 201-1 and 201-2, a preprocessing unit 202, and a DSP (Digital Signal Processor) 203 are provided on the second substrate 200.

The AD conversion unit 201-1 receives a signal output from a pixel via the connection part 120-1. The AD conversion unit 201-2 receives a signal output from a pixel via the connection part 120-2.

The AD conversion units 201-1 and 201-2 each AD-convert the input pixel signals into digital signals. In addition, the AD conversion units 201-1 and 201-2 each may perform processing for reducing noise contained in the pixel signals (typically, CDS (Correlated Double Sampling processing)) and amplification processing before the AD conversion. The digital signals generated by the AD conversion units 201-1 and 201-2 are input to the preprocessing unit 202.

The preprocessing unit 202 performs signal processing on the digital signals output from the AD conversion units 201-1 and 201-2. In this signal processing, in addition to the CDS (Correlated Double Sampling) processing, processing corresponding to part of image processing such as offset removal processing and amplification processing may be performed. For example, in a case where the image data to be processed is color image data, the preprocessing unit 202 may convert the image data into YUV image data, RGB image data, or the like. The preprocessing unit 202 may also execute, as necessary, processing such as noise removal processing and white balance adjustment processing on the image data. In addition, the preprocessing unit 202 executes various signal processing (also referred to as preprocessing) necessary for the DSP 203 to process the image data to be processed.

The DSP 203 is a signal processing circuit that functions as a machine learning unit using a deep neural network (DNN). The DSP 203 executes a process of multiplying dictionary coefficients and the image data by executing a machine learning process program. A result (a machine learning result) obtained by the machine learning process is output to the outside of the photoelectric conversion apparatus. The machine learning result may include image data obtained as a result of the machine learning on image data, various information (metadata) obtained from the image data, and the like.

In a case where the DSP 203 does not execute the processing on the image data output from the preprocessing unit 202, the image data output from the preprocessing unit 202 may be output directly without providing the data to the DSP 203.

The DSP 203 overlaps in position with the pixel array. More specifically, the DSP 203 overlaps with the effective pixel area 101. However, the DSP 203 does not overlap with light-shielded pixel area 103. In the DSP 203, a large amount of heat is generated during the execution of the machine learning process program and the generation of the machine learning result. The amount of generated heat can exceed the amount of heat generated by each of the AD conversion units 201-1 and 201-2 depending on the processing load. When this heat propagates to the light-shielded pixel area 103 included in the pixel array, noise included in the signal output by the pixels of the light-shielded pixel area 103 increases. When the heat propagates to the optical black pixel 104-1, a shift occurs in the black level of the image. Furthermore, depending on the position of the DSP 203, a heat distribution occurs on the first substrate 100 and shading occurs in the outputs provided by the plurality of optical black pixels 104-1. As a result, shading also occurs in the image generated by the signal output by the photoelectric conversion apparatus. When heat propagates to the reference pixel 104-2, the noise included in the signal output by the reference pixel 104-2 increases. Therefore, when the noise reduction processing based on the signal output by the reference pixel 104-2 is performed on the signal output by the effective pixel 102, the noise signal having an additional noise component due to the heat is subtracted from the signal output by the effective pixel 102. As a result, a reduction occurs in the signal accuracy of the effective pixel 102.

In the present embodiment, the DSP 203 is disposed such that it does not overlap, in a plan view, with the light-shielded pixel area 103 when viewed from the upper surface of the first substrate 100 and the second substrate 200 (unless otherwise specified, it is assumed that the plan view is defined as viewed from above the upper surface). This allows a reduction in the propagation of heat from the DSP 203 to the light-shielded pixel area 103. The DSP 203 is disposed at the position that does not overlap with the optical black pixel 104-1 as seen in the plan view.

This suppresses the influence on the black level of the image. Furthermore, the DSP 203 is positions such that it does not overlap with the reference pixel 104-2. This makes it possible to suppress the increase in noise of the reference pixel 104-2, and suppress the reduction in the signal accuracy of the effective pixel 102.

The DSP 203 overlaps with the effective pixel area 101 in the plan view. This suppresses the increase in the area of the second substrate 200 as compared with the case where the DSP 203 is disposed outside the effective pixel area 101. As a result, an increase in the chip size of the photoelectric conversion apparatus is also suppressed.

By employing the structure according to the present embodiment, as described above, it is possible to suppress the heat propagation from the DSP 203 to the light-shielded pixel area 103 while suppressing an increase in the chip size of the photoelectric conversion apparatus. As a result, it is possible to suppress an increase in noise of the signal output from the light-shielded pixel area 103.

First Modification

Figure 4A:
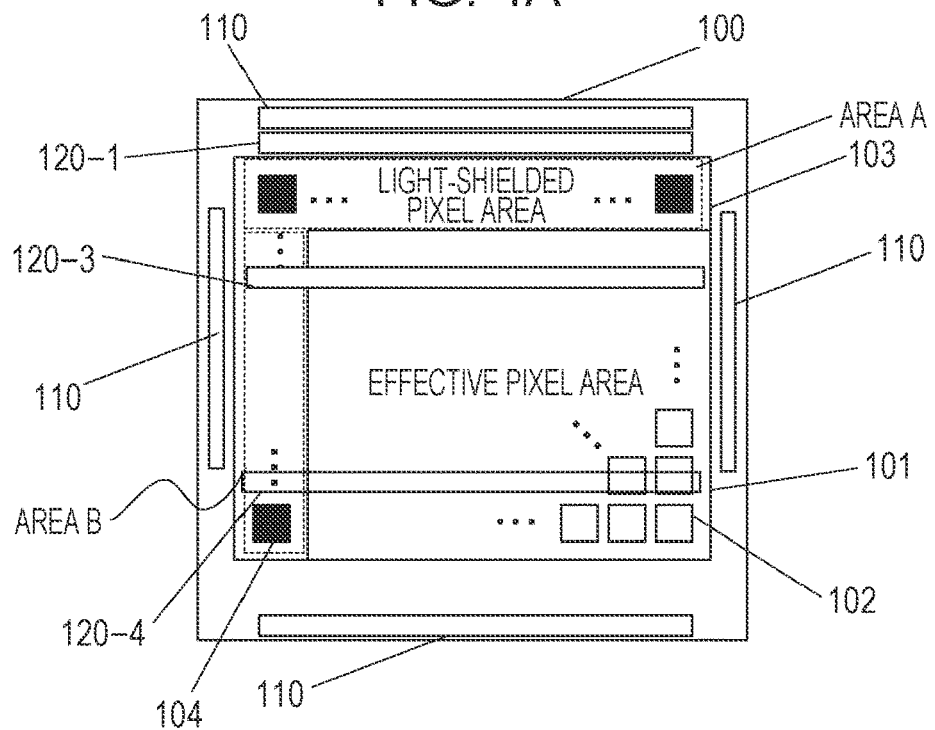
FIG. 4A is a diagram showing an example of a configuration of a first substrate.
Figure 4B:
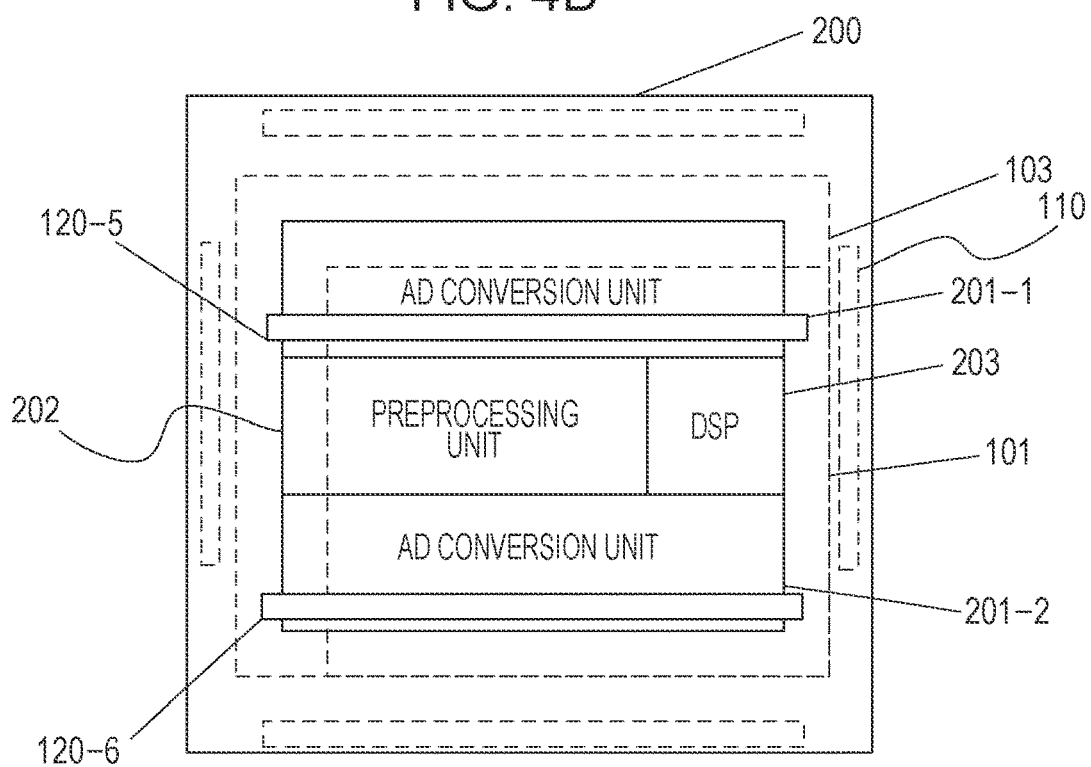
FIG. 4B is a diagram showing an example of a configuration of a second substrate.

In the first embodiment described above, the first substrate 100 and the second substrate 200 are connected by the connection parts 120-1 and 120-2 having a TSV structure disposed outside the pixel array. FIG. 4A shows an example in which connection parts 120-3 and 120-4 are provided at positions so as to overlap the pixel array on the first substrate 100 in a plan view. As shown in FIG. 4B, connection parts 120-5 and 120-6 are provided on the second substrate 200 such that the connection parts 120-5 and 120-6 are respectively connected to the connection parts 120-3 and 120-4.

The connection parts 120-3, 120-4, 120-5, and 120-6 each have an island-shaped connection electrode (metal), and the connection electrodes on the first substrate are connected to the corresponding connection electrodes on the second substrate. An insulating layer is provided, on each substrate, in the layer in which the connection electrodes are provided, and the insulating layer on the first substrate is also connected to the insulating layer on the second substrate. Such a structure in which metals are connected to each other and insulating layers are connected to each other is also called a hybrid connection.

In FIG. 4B, the AD conversion units 201-1 and 201-2 receive signals from pixels respectively via the connection parts 120-5 and 120-6, and perform the AD conversion on the received signals. The functions of the preprocessing units 202-1 and 202-2 and the functions of the DSP 203-1 and 203-2 are the same as those according to the first embodiment. Also in this modification, it is possible to obtain the same effects as those obtained in the first embodiment.

Second Modification

Figure 5:
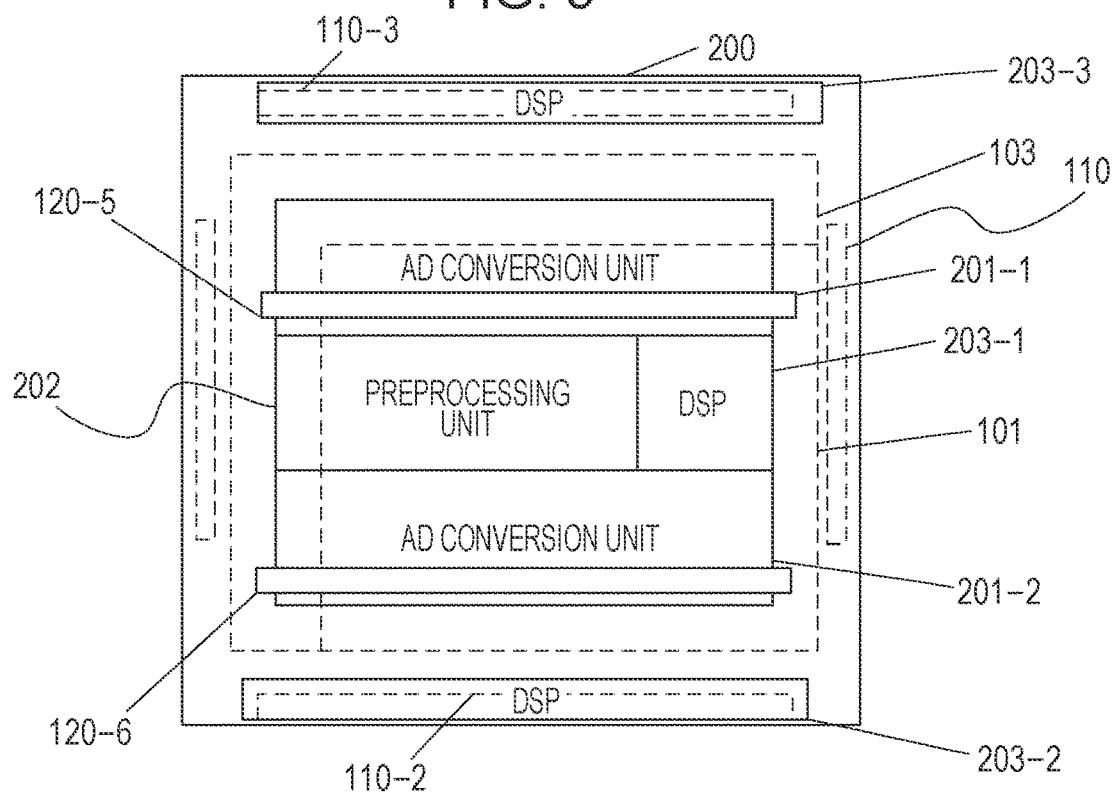
FIG. 5 is a diagram showing an example of a configuration of a second substrate.

FIG. 5 shows a second modification in which additional DSPs are added to the configuration according to the first modification described above. That is, DSP 203-2 and DSP 203-3 are additionally provided on the second substrate 200. The DSP 203-2 may receive the signal output from the AD conversion unit 201-2 or may receive the signal output from the preprocessing unit 202. The DSP 203-3 may receive the signal output from the AD conversion unit 201-3 or may receive the signal output from the preprocessing unit 202.

Both the DSPs 203-2 and 203-3 are disposed at positions that do not overlap with the light-shielded pixel area 103 as seen in a plan view. This suppresses heat propagation to the optical black pixel 104-1 and the reference pixel 104-2 provided in the light-shielded pixel area 103. Furthermore, bypass capacitors 110-2 and 110-3 are provided on the first substrate 100 at positions overlapping with DSPs 203-2 and 203-3 as seen in the plan view. Since the bypass capacitors 110-2 and 110-3 provide heat dissipation, the heat generated by the DSPs 203-2 and 203-3 is efficiently discharged to the outside of the photoelectric conversion apparatus. As a result, heat propagation to the light-shielded pixel area 103 can be further suppressed.

Figure 6:
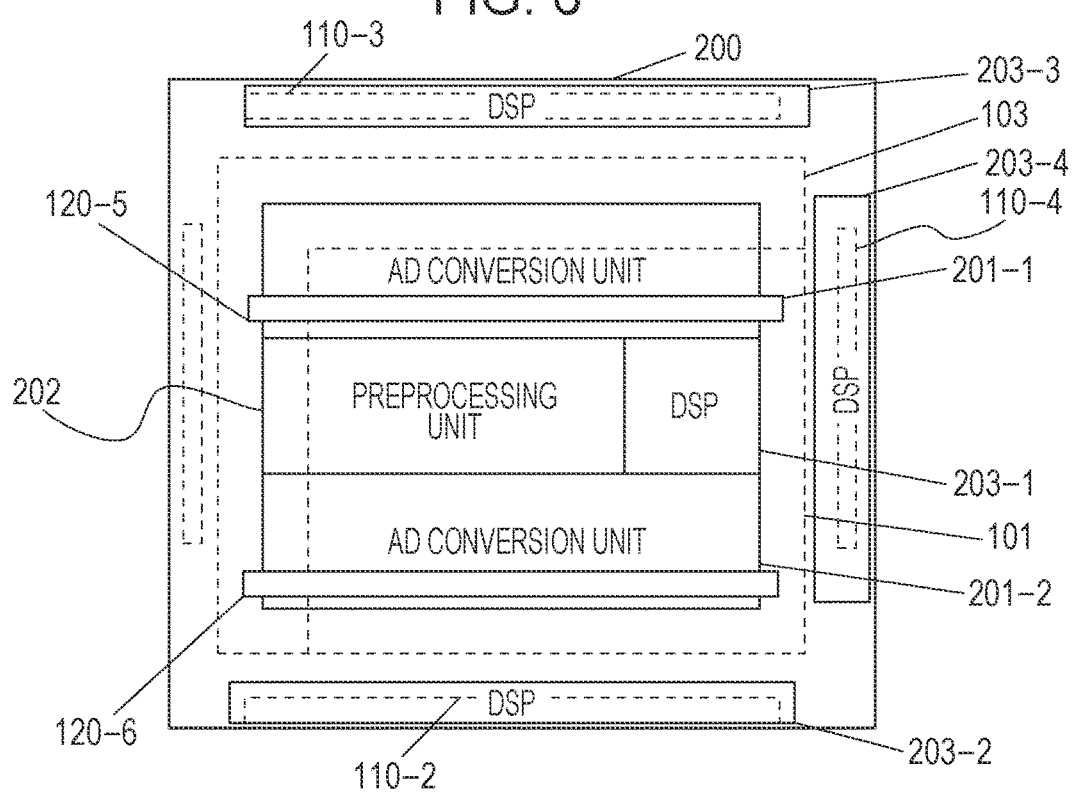
FIG. 6 is a diagram showing an example of a configuration of a second substrate.

A DSP 203-4 may be further provided in a manner shown in FIG. 6. A bypass capacitor 110-4 is disposed, on the first substrate 100, at a position overlapping the DSP 203-4 as seen in the plan view. In the configuration shown in FIG. 6, no DSP 203 is provided in a region close to the area B of the light-shielded pixel area 103 shown in FIG. 1. In other words, the DSP 203 is not provided between one end of the second substrate 200 and one end of the light-shielded pixel area 103 of the first substrate 100. This suppresses the influence of heat generated by the DSP 203 on the light-shielded pixel area 103. On the other hand, the DSP 203-3 is provided between the other end of the second substrate 200 and the other end of the light-shielded pixel area 103 of the first substrate 100.

Therefore, the area A of the light-shielded pixel area is more susceptible to heat generation by the DSP 203 than the area B of the light-shielded pixel area of the area B. By comparing the output from the light-shielded pixel area in the area A with the output from the light-shielded pixel area in the area B, it is possible to analyze the influence of the heat received by the light-shielded pixel area in the area A. By feeding the influence of this heat back to the output from the light-shielded pixel area of the area A and to the output from the effective pixel 102, it is possible to further accurately reduce the noise component of the effective pixel 102. As described above, by providing the light-shielded pixel areas one of which is susceptible and the other is not susceptible to the influence of the heat generated by the DSP 203, it is possible to analyze the influence of the heat generated by the DSP 203 on noise.

Third Modification

Figure 7:
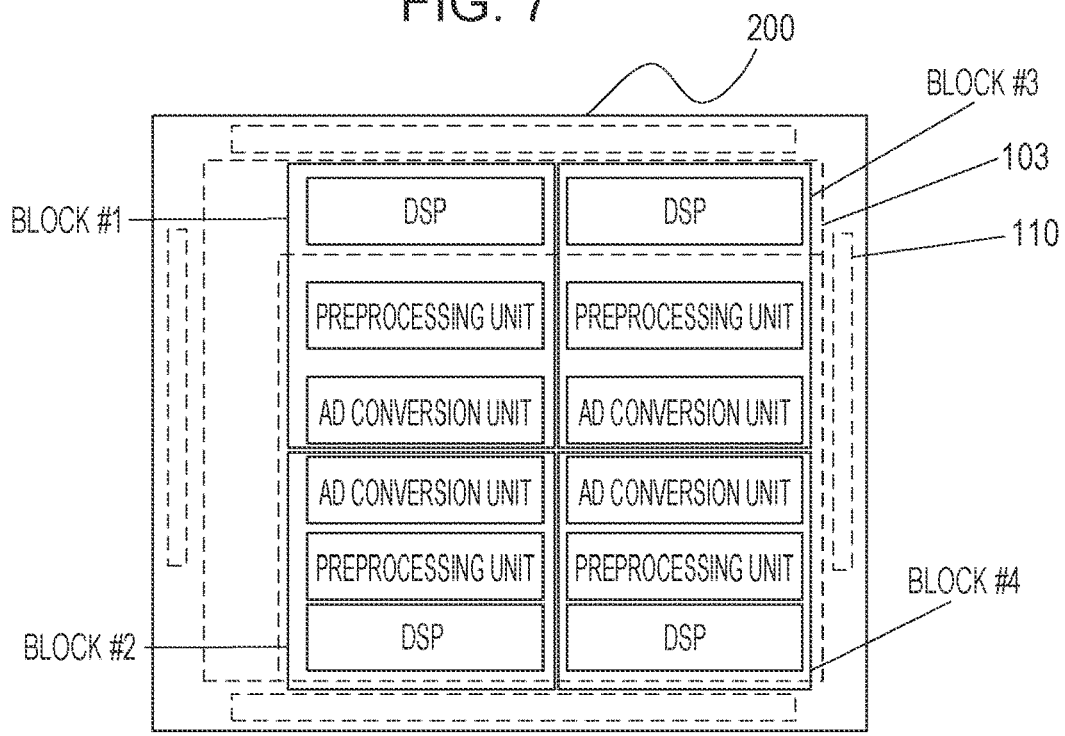
FIG. 7 is a diagram showing an example of a configuration of a second substrate.

FIG. 7 shows a third modification which is obtained by changing the arrangement of the AD conversion unit, the preprocessing unit, and the DSP of the first modification. The connection part portion 120 may be the same as that of the first modification. One AD conversion unit, one preprocessing unit, and one DSP are provided in each of blocks #1 to #4. The functions of the AD conversion unit, the preprocessing unit, and the DSP are the same as those in the first embodiment. In blocks #1 and #3, the DSP overlaps with the light-shielded pixel area 103, but in blocks #2 and #4, the DSP is arranged in an area that does not overlap with the light-shielded pixel area 103. Also in this configuration, it is possible to reduce the influence of the heat generated by the DSP on the light-shielded pixel area 103 as compared with the case where all the DSPs overlap with the light-shielded pixel area 103.

Fourth Modification

Figure 8:
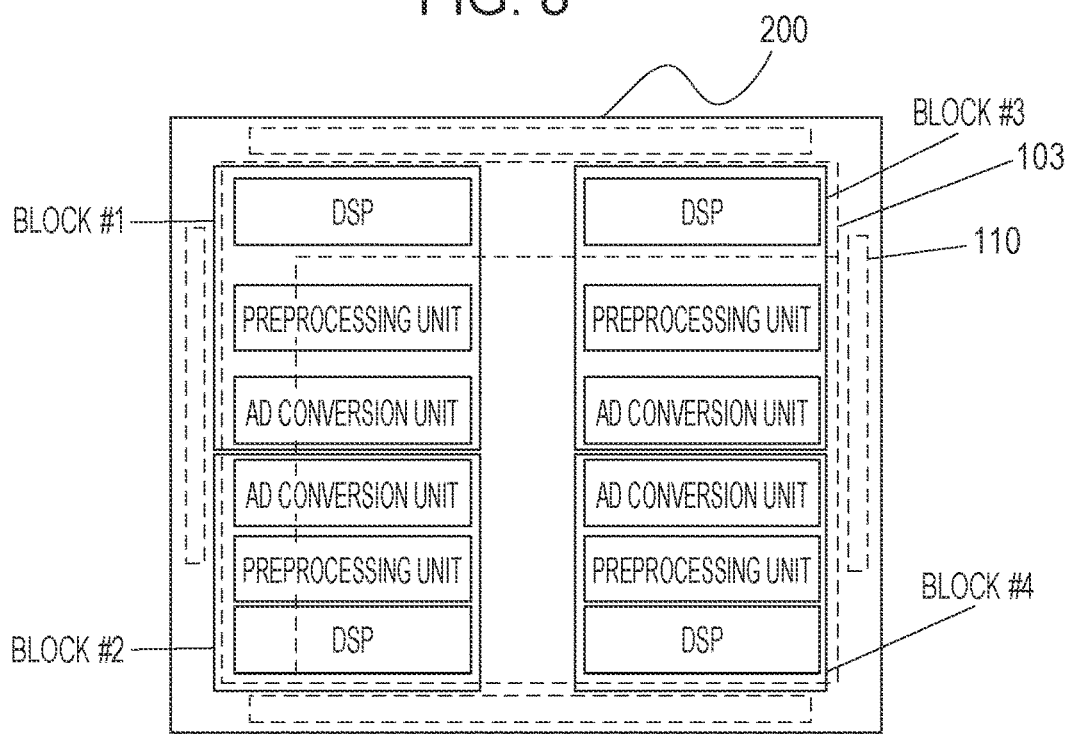
FIG. 8 is a diagram showing an example of a configuration of a second substrate.

FIG. 8 shows a fourth modification which is different from the third modification in that the DSPs in the block #1 and the block #3 overlap with the light-shielded pixel area in the area B shown in FIG. 1. However, the DSP in the block #4 does not overlap with the light-shielded pixel area. This configuration allows it to reduce the influence of the heat generated by the DSP on the light-shielded pixel area 103 as compared with the case where all the DSPs overlap with the light-shielded pixel area 103.

Fifth Modification

Figure 9:
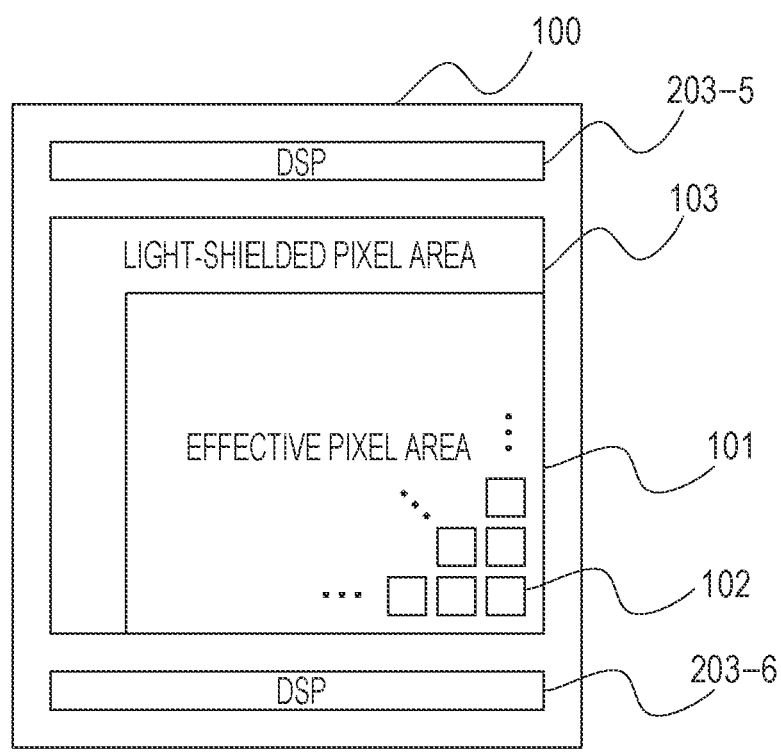
FIG. 9 is a diagram showing an example of a configuration of a first substrate.

In the first embodiment described above, the DSP is provided only on the second substrate 200, but a DSP may be further provided on the first substrate 100. In this case, as shown in FIG. 9, DSPs 203-5 and 203-6 are disposed such that the pixel array is located between the DSPs 203-5 and 203-6. In this case, part of the processing performed by the DSP disposed on the second substrate 200 may be performed by the DSP disposed on the first substrate 100 thereby suppressing the heat generation by the DSP disposed on the second substrate 200. Furthermore, since part of the DSP 203 is disposed on the first substrate 100 and the other part is disposed on the second substrate 200, it is possible to reduce unevenness in the heat distribution in the photoelectric conversion apparatus.

Second Embodiment

Figure 10:
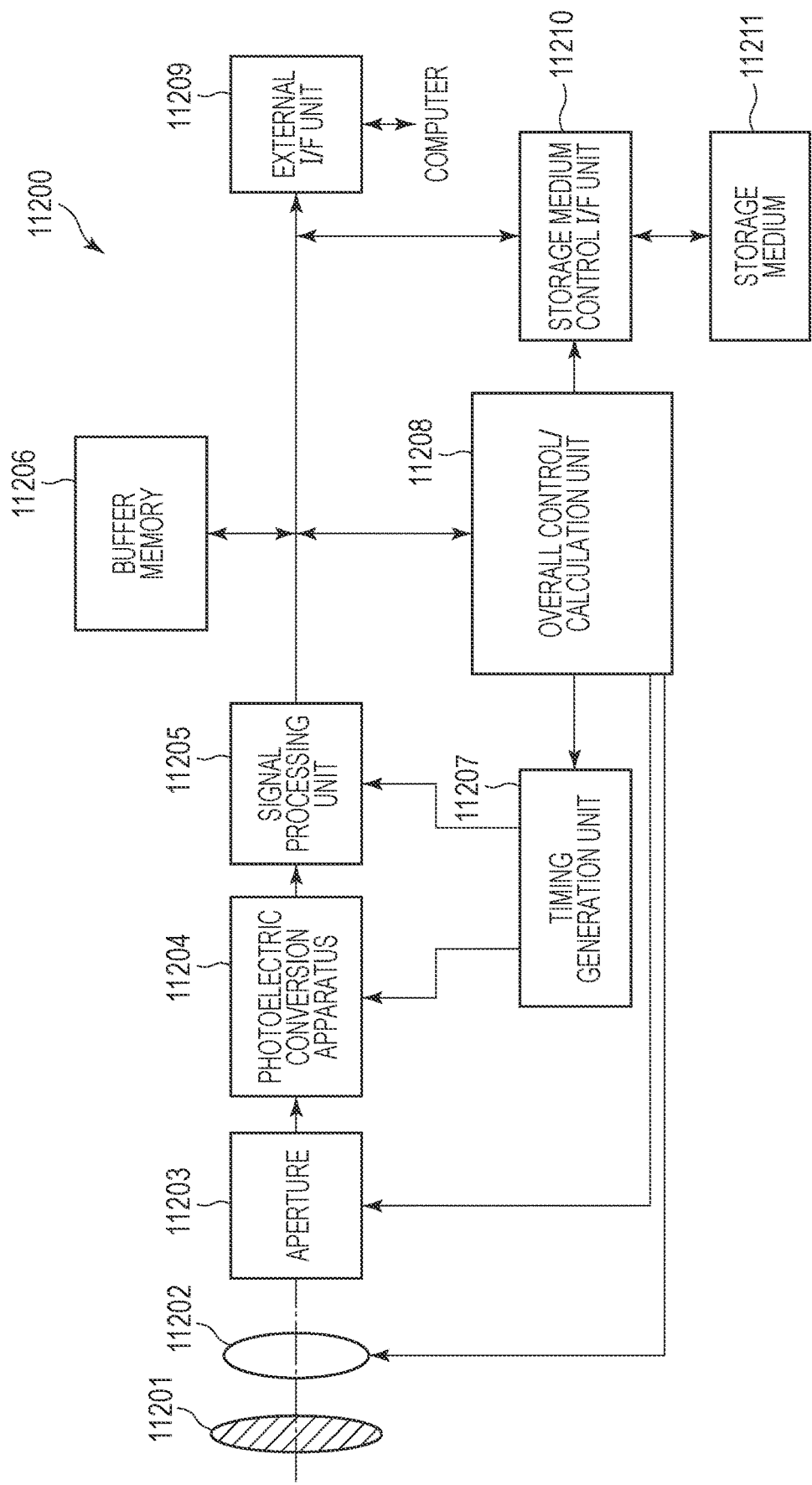
FIG. 10 is a functional block diagram of an example of photoelectric conversion system.

FIG. 10 is a block diagram showing a configuration of a photoelectric conversion system 11200 according to a second embodiment. The photoelectric conversion system 11200 according to this embodiment includes a photoelectric conversion apparatus 11204. As for the photoelectric conversion apparatus 11204, the photoelectric conversion apparatus according to one of embodiments described above may be used. The photoelectric conversion system 11200 may be used, for example, as an imaging system. Specific examples of the imaging system include a digital still camera, a digital camcorder, a security camera, a network camera, and the like. In the example shown in FIG. 10, the photoelectric conversion system 11200 is used as a digital still camera.

The photoelectric conversion system 11200 shown in FIG. 10 includes a photoelectric conversion apparatus 11204 and a lens 11202 that forms an optical image of a subject on the photoelectric conversion apparatus 11204. The photoelectric conversion system 11200 further includes an aperture 11203 for varying the amount of light passing through the lens 11202, and a barrier 11201 for protecting the lens 11202. The lens 11202 and the aperture 11203 constitute an optical system that focuses light on the photoelectric conversion apparatus 11204.

The photoelectric conversion system 11200 also includes a signal processing unit 11205 that processes an output signal provided from the photoelectric conversion apparatus 11204. The signal processing unit 11205 performs signal processing, such as various correction processing and compression processing, on the input signal as necessary, and outputs the resultant signal. The photoelectric conversion system 11200 further includes a buffer memory unit 11206 for temporarily storing image data and an external interface unit (external I/F unit) 11209 for communicating with an external computer or the like. The photoelectric conversion system 11200 further includes a storage medium 11211 such as a semiconductor memory for storing and reading image data, and a storage medium control interface unit (storage medium control I/F unit) 11210 via which to store or read image data in/from the storage medium 11211. The storage medium 11211 may be disposed inside the photoelectric conversion system 11200 or may be detachable. Communication between the storage medium control I/F unit 11210 and the storage medium 11211 and/or communication with the external I/F unit 11209 may be performed wirelessly.

The photoelectric conversion system 11200 further includes an overall control/calculation unit 11208 that performs various calculations and controls the entire digital still camera, and a timing generation unit 11207 that outputs various timing signals to the photoelectric conversion apparatus 11204 and the signal processing unit 11205. The timing signal or the like may be input from the outside. In this case, the photoelectric conversion system 11200 may include at least the photoelectric conversion apparatus 11204 and the signal processing unit 11205 that processes an output signal provided from the photoelectric conversion apparatus 11204. The overall control/calculation unit 11208 and the timing generation unit 11207 may be configured to perform part or all of the control functions of the photoelectric conversion apparatus 11204.

The photoelectric conversion apparatus 11204 outputs an image signal to the signal processing unit 11205. The signal processing unit 11205 performs particular signal processing on the image signal output from the photoelectric conversion apparatus 11204, and outputs resultant image data. The signal processing unit 11205 may perform a distance measurement calculation on the signal output from the photoelectric conversion apparatus 11204. The signal processing unit 11205 and the timing generation unit 11207 may be disposed on the photoelectric conversion apparatus. That is, the signal processing unit 11205 and the timing generation unit 11207 may be disposed on a substrate on which pixels are arranged, or may be disposed on another substrate. By forming an imaging system using the photoelectric conversion apparatus according to one of the embodiments described above, it is possible to realize an imaging system capable of acquiring a higher quality image.

Third Embodiment

Figure 11:
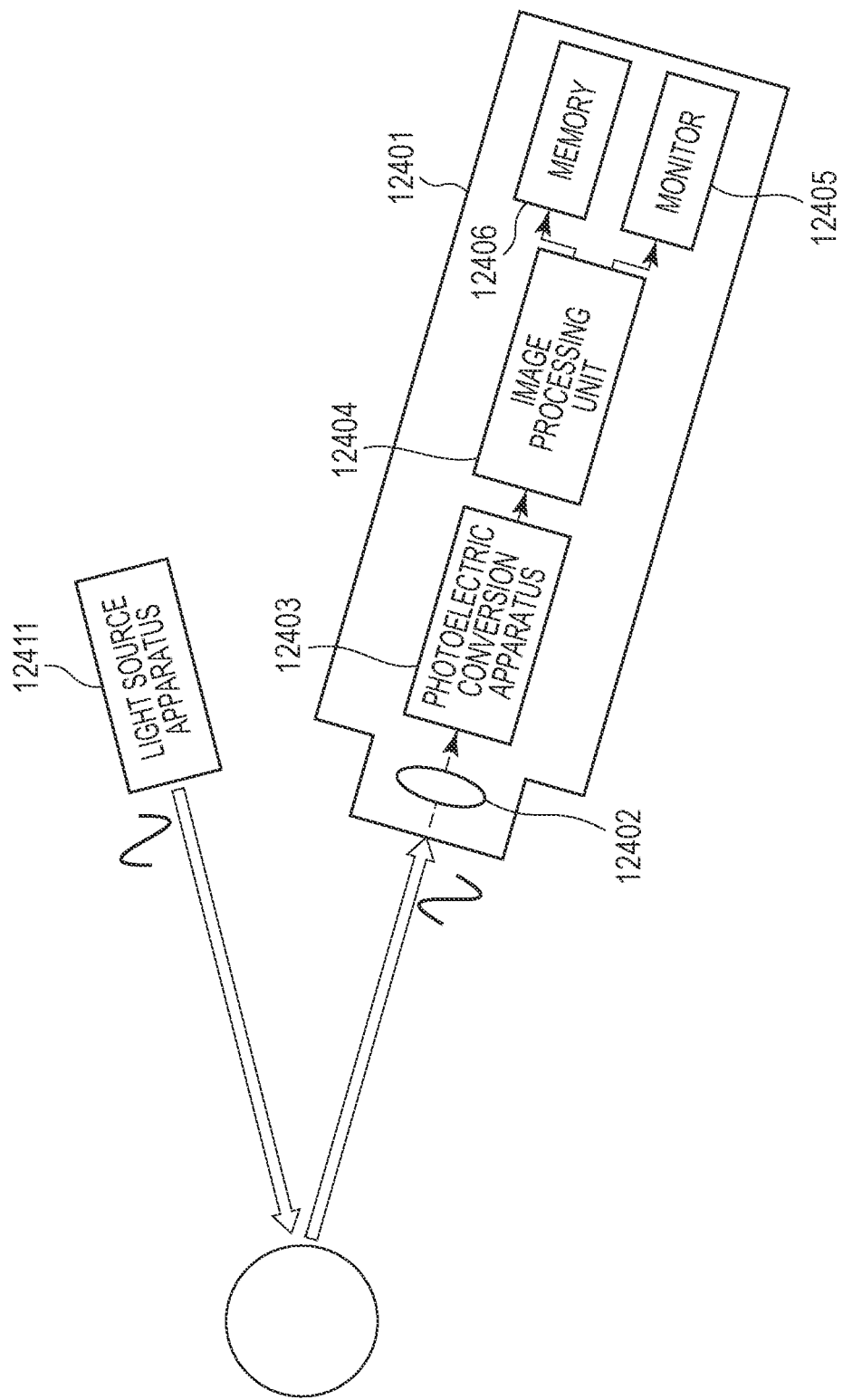
FIG. 11 is a functional block diagram of an example of a distance sensor.

FIG. 11 is a block diagram showing an example of a configuration of a distance image sensor, which is an electronic device realized using the photoelectric conversion apparatus according to one of the embodiments described above.

As shown in FIG. 11, the distance image sensor 12401 includes an optical system 12407, a photoelectric conversion apparatus 12408, an image processing circuit 12404, a monitor 12405, and a memory 12406. The distance image sensor 12401 acquires a distance image indicating a distance to a subject by receiving light (modulated light or pulsed light) that is projected from a light source apparatus 12409 toward the subject and reflected by the surface of the subject.

The optical system 12407 includes one or a plurality of lenses and functions to conduct image light (incident light) from a subject to the photoelectric conversion apparatus 12408 so as to form an image on a light receiving surface (a sensor unit) of the photoelectric conversion apparatus 12408.

As the photoelectric conversion apparatus 12408, the photoelectric conversion apparatus according to one of the embodiments described above is used. A distance signal indicating a distance is obtained from a light reception signal output from the photoelectric conversion apparatus 12408, and the resultant distance signal is supplied to the image processing circuit 12404.

The image processing circuit 12404 performs image processing for constructing a distance image based on the distance signal supplied from the photoelectric conversion apparatus 12408. The distance image (image data) obtained by the image processing is supplied to the monitor 12405 and displayed thereon, or supplied to the memory 406 and stored (recorded) therein.

In the distance image sensor 12401 configured in the above-described manner, use of the photoelectric conversion apparatus with higher-quality pixels described above makes it possible to acquire, for example, a more accurate distance image.

Fourth Embodiment

The techniques according to the present disclosure (the present techniques) can be applied to various products. For example, the techniques according to the present disclosure may be applied to endoscopic surgery systems.

Figure 12:
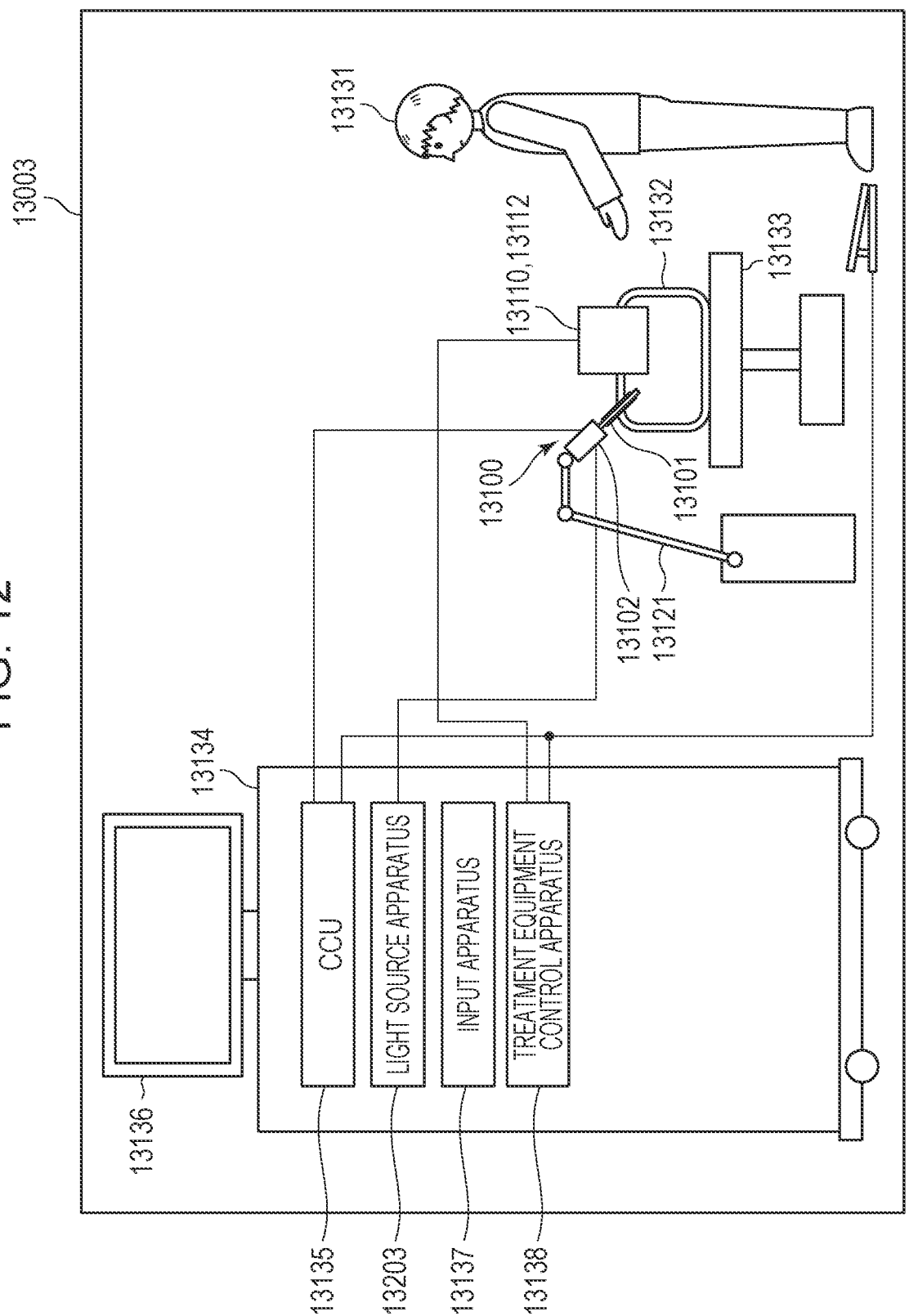
FIG. 12 is a functional block diagram of an example of an endoscopic surgery system.

FIG. 12 is a schematic diagram showing an example of a configuration of an endoscopic surgery system to which the technique according to the present disclosure (the present technique) can be applied.

More specifically, FIG. 12 illustrates a manner in which a surgeon (doctor) 13131 performs surgery on a patient 13132 on a patient bed 13133 using an endoscopic surgery system 13003. As shown, the endoscopic surgery system 13003 includes an endoscope 13100, a surgical tool 13110, and a cart 13134 equipped with various apparatuses for endoscopic surgery.

The endoscope 13100 includes a lens barrel 13101 whose anterior part with a particular length is inserted in body cavity of the patient 13132, and a camera head 13102 connected to a base end of the lens barrel 13101. In the example shown in FIG. 12, the endoscope 13100 is configured as a so-called rigid endoscope having the rigid barrel 13101. However the endoscope 13100 may be configured as a so-called flexible endoscope having a flexible barrel.

An opening in which an objective lens is fitted is formed at the tip of the lens barrel 13101. A light source apparatus 13203 is connected to the endoscope 13100. Light generated by the light source apparatus 13203 is guided to the tip of the lens barrel by a light guide extending inside the lens barrel 13101. This light is emitted through the objective lens toward an observation target object in the body cavity of the patient 13132. The endoscope 13100 may be a forward-viewing endoscope, a forward-oblique viewing endoscope, or a side viewing endoscope.

An optical system and a photoelectric conversion apparatus are provided inside the camera head 13102, and reflected light (observation light) from the observation target object is focused on the photoelectric conversion apparatus by the optical system. The observation light is photoelectrically converted by the photoelectric conversion apparatus into an electric signal corresponding to the observation light. As a result, an image signal corresponding to the observation image is obtained. As the photoelectric conversion apparatus, the photoelectric conversion apparatus according to one of the embodiments described above may be used. The image signal is transmitted as RAW data to the camera control unit (CCU) 13135.

The CCU 13135 includes a CPU (Central Processing Unit), a GPU (Graphics Processing Unit), etc., and generally controls the operations of the endoscope 13100 and the display apparatus 13136. Furthermore, the CCU 13135 receives the image signal from the camera head 13102, and performs various image processing such as development processing (demosaic processing) on the image signal for displaying an image based on the image signal.

The display apparatus 13136 displays, under the control of the CCU 13135, the image based on the image signal subjected to the image processing by the CCU 13135.

The light source apparatus 13203 includes a light source such as an LED (Light Emitting Diode), and supplies irradiation light to the endoscope 13100 when an image of an operation part or the like is captured.

The input apparatus 13137 functions as an input interface to the endoscopic surgery system 13003. A user can input various information and instructions to the endoscopic surgery system 13003 via the input apparatus 13137.

The treatment equipment control apparatus 13138 controls driving of energy treatment equipment 13112 for cauterization or incision of a tissue, sealing of blood vessels, etc.

The light source apparatus 13203 for supplying irradiation light to the endoscope 13100 when an image of an operation part is captured may be realized using a white light source using an LED, a laser light source, or a combination thereof. In a case where the white light source is realized by a combination of RGB laser light sources, it is possible to accurately control the output intensity and output timing of each color (each wavelength), and thus the light source apparatus 13203 can adjust the white balance of the captured image. Furthermore, in this case, an image may be captured such that the laser light from each of the RGB laser light sources is supplied to the observation target object in a time-division manner, and the imaging device of the camera head 13102 is driven in synchronization with the light supplying timing so as to capture an image of each color in the time-division manner. In this method, a color image can be obtained without providing a color filter on the imaging device.

The light source apparatus 13203 may be controlled such that the intensity of the output light is changed at particular time intervals. By controlling the imaging device of the camera head 13102 to be driven in synchronization with the timing of the change in the light intensity to acquire images in a time-division manner and combining the images, it is possible to generate an image with a high dynamic range without having underexposure and overexposure.

The light source apparatus 13203 may be configured to be able to supply light in a particular wavelength band for special light observation. The special light observation is realized by using, for example, dependence of absorption of light by body tissues on wavelength of light absorption in body tissues. More specifically, a target tissue such as a blood vessel on the surface layer of a mucous membrane may be irradiated with light with a narrow band compared with normal irradiation light (that is, white light) thereby obtaining an image of the target tissue with high contrast. Alternatively, the special light observation may be realized by fluorescence observation in which an image is obtained by fluorescence which occurs when a target is irradiated with excitation light. In the fluorescence observation, a body tissue is irradiated with excitation light, and fluorescence that occurs on the body tissue in response to the excitation by light is observed, or a reagent such as indocyanine green (ICG) is locally injected into the body tissue and the body tissue is irradiated with excitation light with a wavelength corresponding to the fluorescence wavelength of the reagent and a resultant fluorescence image is observed. As described above, the light source apparatus 13203 may be configured to be capable of supplying narrow band light and/or excitation light for the special light observation.

Fifth Embodiment

Figure 13A:
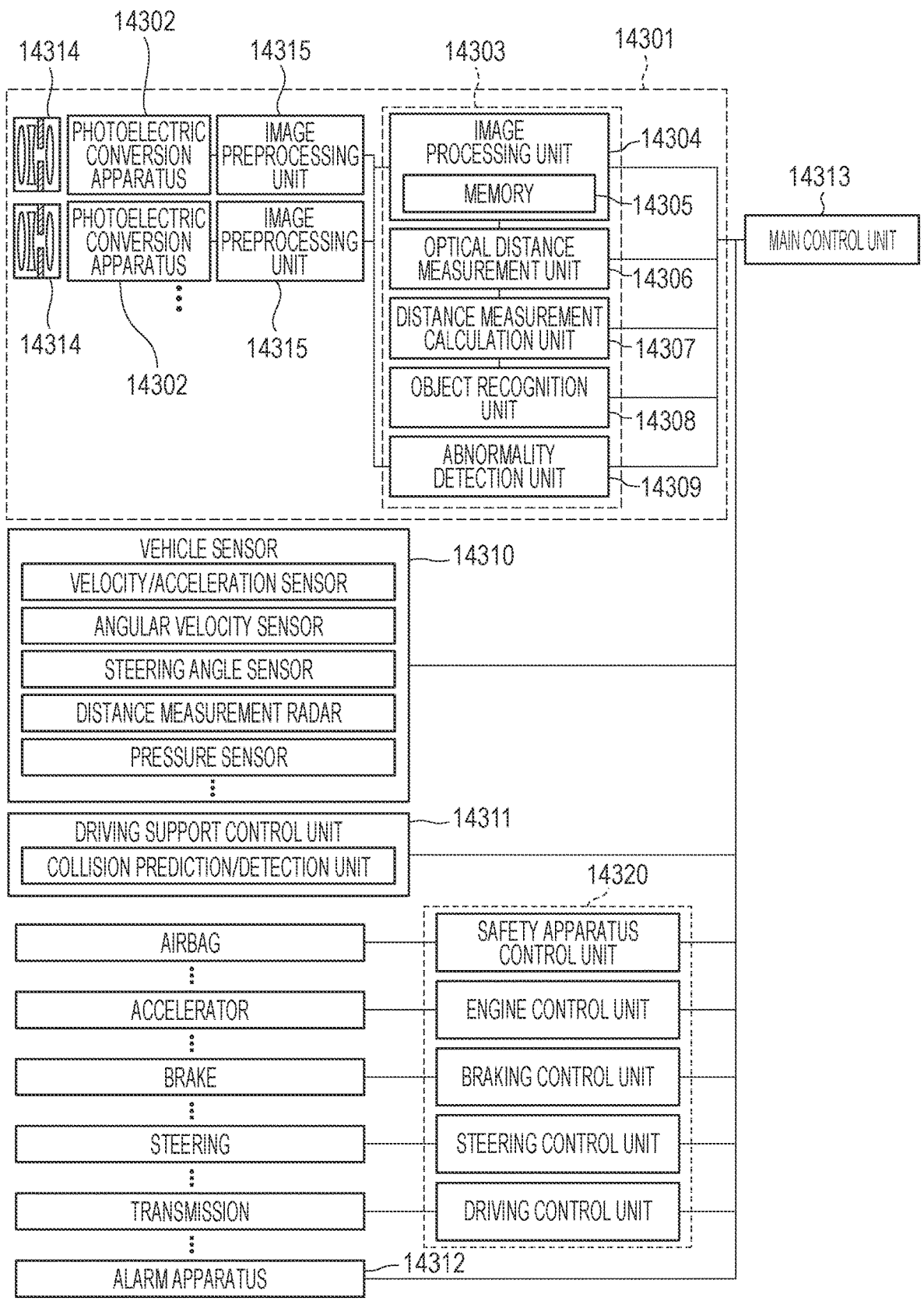
FIG. 13A is a diagram illustrating of an example of a photoelectric conversion system.

A photoelectric conversion system and a mobile body according to a fifth embodiment are described below with reference to FIGS. 13A and 13B. FIG. 13A is a schematic view showing an example of a configuration of a photoelectric conversion system according to the fifth embodiment and FIG. 13B shows an example of a configuration of a mobile body according to the fifth embodiment. In this embodiment, an in-vehicle camera is described as an example of the photoelectric conversion system.

More specifically, FIG. 13B shows an example of a vehicle system and FIG. 13A shows an example of a photoelectric conversion system for imaging which is disposed in the vehicle system. The photoelectric conversion system 14301 includes a photoelectric conversion apparatus 14302, an image preprocessing unit 14315, an integrated circuit 14303, and an optical system 14314. The optical system 14314 forms an optical image of a subject on the photoelectric conversion apparatus 14302. The photoelectric conversion apparatus 14302 converts the optical image of the subject formed by the optical system 14314 into an electric signal. The photoelectric conversion apparatus 14302 may be a photoelectric conversion apparatus according to one of the embodiments described above. The image preprocessing unit 14315 performs particular signal processing on the signal output from the photoelectric conversion apparatus 14302. The function of the image preprocessing unit 14315 may be incorporated in the photoelectric conversion apparatus 14302. The photoelectric conversion system 14301 includes at least two sets of the optical system 14314, the photoelectric conversion apparatus 14302, and the image preprocessing unit 14315, and is configured such that a signal output from the image preprocessing unit 14315 of each set is input to the integrated circuit 14303.

The integrated circuit 14303 is an integrated circuit designed for use in imaging system applications, and includes an image processing unit 14304 including a memory 14305, an optical distance measurement unit 14306, a distance measurement calculation unit 14307, an object recognition unit 14308, and an abnormality detection unit 14309. The image processing unit 14304 performs image processing such as development processing and/or defect correction processing on the output signal provided from the image preprocessing unit 14315. The memory 14305 temporarily stores the captured image and information indicating a position of a defect pixel. The optical distance measurement unit 14306 performs focusing of an image of a subject, and distance measurement processing. The distance measurement calculation unit 14307 calculates the distance from a plurality of image data acquired by the plurality of photoelectric conversion apparatuses 14302 thereby obtaining distance measurement information. The object recognition unit 14308 recognizes a subject such as a car, a road, a sign, or a person. When the abnormality detection unit 14309 detects an abnormality in the photoelectric conversion apparatus 14302, the abnormality detection unit 14309 notifies a main control unit 14313 of the abnormality.

The integrated circuit 14303 may be realized by hardware designed for dedicated use or by a software module, or may be realized by a combination thereof. Alternatively, the integrated circuit 14303 may be realized by an FPGA (Field Programmable Gate Array), an ASIC (Application Specific Integrated Circuit), or the like, or may be realized by a combination thereof.

The main control unit 14313 generally controls the operations of the photoelectric conversion system 14301, the vehicle sensor 14310, the control unit 14320, and the like. The main control unit 14313 may not be provided. In this case, a communication interface may be provided in each of the photoelectric conversion system 14301, the vehicle sensor 14310, and the control unit 14320, and a control signal may be transmitted among the photoelectric conversion system 14301, the vehicle sensor 14310, and the control unit 14320 via a communication network (according to, for example, CAN standard).

The integrated circuit 14303 has a function of transmitting a control signal or a setting value to the photoelectric conversion apparatus 14302 according to a control signal received from the main control unit 14313 or according to a control signal generated by a control unit provided in the integrated circuit 14303.

The photoelectric conversion system 14301 is connected to the vehicle sensor 14310, and can detect a running state in terms of the vehicle speed, yaw rate, steering angle and the like of the vehicle on which the photoelectric conversion system 14301 is disposed and also can detect a state of the environment outside the vehicle, the state of other vehicles/obstacles. The vehicle sensor 14310 also functions as a distance information acquisition unit for acquiring distance information indicating a distance to an object. The photoelectric conversion system 14301 is connected to a driving support control unit 1311 that provides various driving support such as automatic steering, automatic cruising, collision prevention, and/of the like. A collision prediction/detection function is also provided. In this function, a collision with another vehicle/object is predicted or an occurrence of a collision is detected based on a detection result provided by the photoelectric conversion system 14301 and/or the vehicle sensor 14310. When a collision is predicted, a control operation to avoid the collision is performed, and a safety apparatus is activated in the event of the collision.

The photoelectric conversion system 14301 is also connected to an alarm apparatus 14312 that issues an alarm to a driver based on the prediction/detection result by the collision prediction/detection unit. For example, in a case where the prediction/detection result by the collision prediction/detection unit indicates that a collision is going to occur with a high probability, the main control unit 14313 controls the vehicle to avoid the collision or reduce a damage by applying the brakes, releasing the accelerator, or suppressing the engine output.

The alarm apparatus 14312 warns the user by sounding an alarm, displaying alarm information on a display screen of a car navigation system or a meter panel, or vibrating a seat belt or a steering wheel.

In the present embodiment, an image around the vehicle is captured by the photoelectric conversion system 14301. More specifically, for example, an image of an environment in front of or behind the vehicle is captured. FIG. 13B shows an example of a manner of disposing the photoelectric conversion systems 14301 for a case where an image of an environment in front of the vehicle is captured by the photoelectric conversion system 14301.

The two photoelectric conversion apparatuses 14302 are disposed on the front of the vehicle 14300. More specifically, the center line of the external shape (for example, the width) of the vehicle 14300 extending in forward/backward running direction is taken as an axis of symmetry, and the two photoelectric conversion apparatuses 14302 are disposed line-symmetrically about the axis of symmetry. This configuration is preferable for acquiring distance information indicating the distance between the vehicle 14300 and an imaging target object, and preferable for determining the possibility of collision.

It is preferable that the photoelectric conversion apparatuses 14302 are disposed so as not to obstruct the field of view of the driver who is trying to view the situation outside the vehicle 14300 from the driver's seat. The alarm apparatus 14312 is preferably disposed such that the driver can be easily view the alarm apparatus 14312.

In the embodiment described above, by way of example, the control is performed to avoid a collision with another vehicle. However, the present embodiment can also be applied to a control to automatically drive following another vehicle, a control to automatically drive so as not to go out of a lane, and the like. Furthermore, the photoelectric conversion system 14301 can be applied not only to a vehicle but also to a mobile body (a mobile apparatus) such as a ship, an aircraft, an industrial robot, and/or the like. Furthermore, it can be applied not only to mobile bodies but also to a wide variety of devices that use object recognition processing, such as intelligent transportation systems (ITS).

The photoelectric conversion apparatus of according to the present disclosure may be configured to be capable of acquiring various information such as distance information.

Sixth Embodiment

Figure 14A:
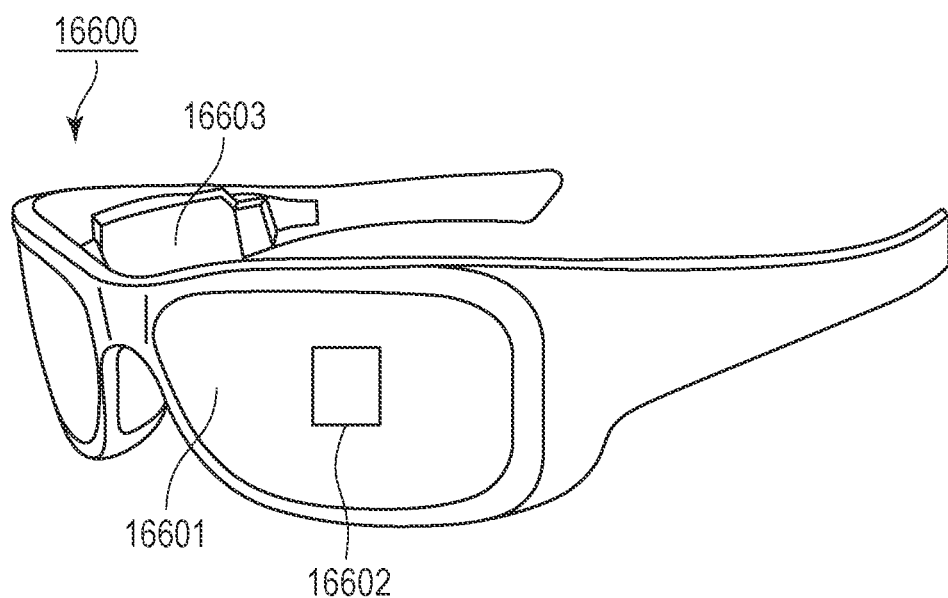
FIGS. 14A and 14B each are a schematic diagram of an example of smart glasses.
Figure 14B:
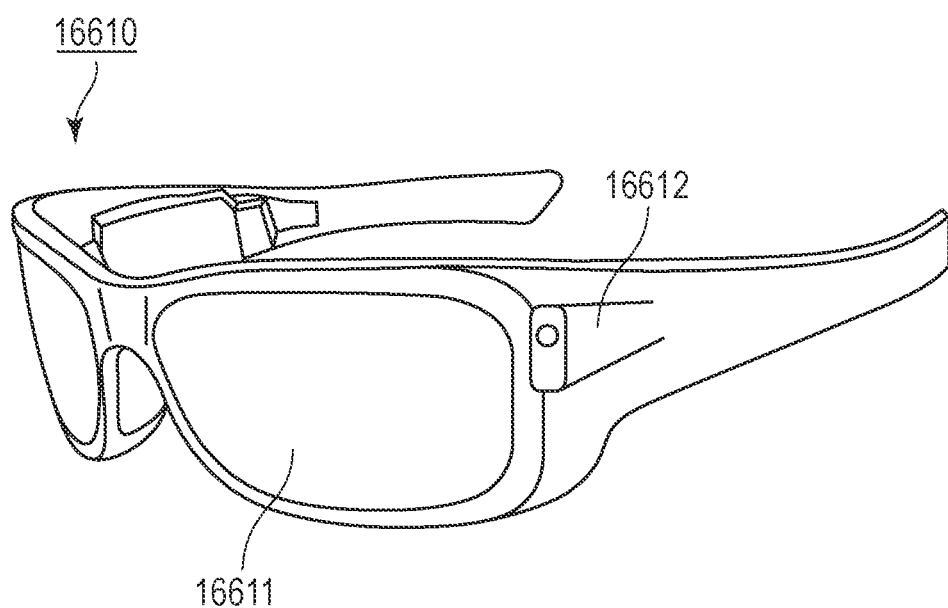

FIGS. 14A and 14B each illustrate, as one of examples of applications, eyeglasses 16600 (smart glasses). The eyeglasses 16600 have a photoelectric conversion apparatus 16602. The photoelectric conversion apparatus 16602 may be a photoelectric conversion apparatus according to one of the embodiments described above. A display apparatus including a light emitting device such as an OLED or an LED may be provided on a back surface side of a lens 16601. One or more photoelectric conversion apparatuses 16602 may be provided. When a plurality of photoelectric conversion apparatuses are used, types thereof may be the same or different. The positions where the photoelectric conversion apparatuses 16602 are disposed is not limited to those shown in FIG. 14A.

The eyeglasses 16600 further include a control apparatus 16603. The control apparatus 16603 functions as a power source for supplying power to the photoelectric conversion apparatus 16602 and to the display apparatus described above. The control apparatus 16603 controls the operations of the photoelectric conversion apparatus 16602 and the display apparatus. The lens 16601 has an optical system for condensing light on the photoelectric conversion apparatus 16602.

FIG. 14B illustrates another example of eyeglasses 16610 (smart glasses).

The eyeglasses 16610 has a control apparatus 16612, wherein the control apparatus 16612 includes a display apparatus and a photoelectric conversion apparatus corresponding to the photoelectric conversion apparatus 16602. The lens 16611 has an optical system to project light generated by the display apparatus and the photoelectric conversion apparatus in the control apparatus 16612 thereby projecting an image on the lens 16611. The control apparatus 16612 functions as the power source for supplying electric power to the photoelectric conversion apparatus and the display apparatus, and functions to control the operations of the photoelectric conversion apparatus and the display apparatus. The control apparatus may include a line-of-sight detection unit that detects a line of sight of a user who wears the eyeglasses 16610. Infrared light may be used to detect the line of sight. An infrared light emitting unit emits infrared light toward an eyeball of the user who is gazing at the displayed image. An image of the eyeball can be obtained by detecting reflected light of the emitted infrared light from the eyeball by an imaging unit having a light receiving element. By providing a reducing unit for reducing light from the infrared emitting unit to the display unit as seen in a plan view, the degradation in the image quality is reduced.

The user's line of sight to the displayed image is detected from the image of the eyeball captured using the infrared light. An arbitrary known method can be used in the line-of-sight detection using the captured image of the eyeball. For example, a line-of-sight detection method based on a Purkinje image using reflection of irradiation light on a cornea can be used.

More specifically, the line-of-sight detection process is performed based on a pupillary conical reflex method. The line of sight of the user is detected by calculating a line-of-sight vector representing a direction (a rotation angle) of the eyeball based on the image of the pupil and the Purkinje image included in the captured image of the eyeball using the pupillary corneal reflex method.

The display apparatus according to the present embodiment may include a photoelectric conversion apparatus having a light receiving element, and may control the image displayed on the display apparatus based on the user's line-of-sight information provided from the photoelectric conversion apparatus.

More specifically, the display apparatus determines a first field-of-view area being watched by the user and a second field-of-view area other than the first field-of-view area based on the line-of-sight information. The first field-of-view area and the second field-of-view area may be determined by the control apparatus of the display apparatus, or may receive information indicating the first field-of-view area and the second field-of-view area determined by an external control apparatus. In the display area of the display apparatus, the display resolution of the first field of view area may be controlled to be higher than the display resolution of the second field of view area. That is, the resolution of the second field-of-view area may be lower than that of the first field-of-view area.

The display area may include a first display area and a second display area different from the first display area. The priorities for the first display area and the second display area may be determined based on the line-of-sight information. The first field of view area and the second field of view area may be determined by the control apparatus of the display apparatus, or may receive those determined by the external control apparatus. The resolution of the high-priority area may be controlled higher than the resolution of the area other than the high-priority region. That is, the resolution of the area having a relatively low priority may be controlled to be low.

Note that the determination of the first field-of-view area and the determination of the higher-priority area may be performed using AI. The AI may be based on a model configured to estimate the angle of the line of sight and the distance to a target object ahead of the line of sight from an image of an eyeball wherein the model is built by performing learning using training data of an image of the eyeball and a direction in which the eyeball captured on the image was actually directed. The AI program may be possessed by the display apparatus, the photoelectric conversion apparatus, or the external apparatus. In a case where the AI program is possessed by the external apparatus, it is transferred to the display apparatus via communication.

In a case where the displaying is controlled based on the visual detection, it is possible to preferably apply the technique to smart glasses further including a photoelectric conversion apparatus for capturing an image of the outside. Smart glasses can display captured external information in real time.

Seventh Embodiment

A system according to a seventh embodiment is described below with reference to FIG. 15. The system according to this seventh embodiment can be applied to a pathological diagnosis system used by a doctor or the like to observe cells or tissues collected from a patient to diagnose a lesion, or to a diagnosis support system for supporting pathological diagnosis. The system according to the present embodiment may diagnose a lesion or assist the diagnosis based on an acquired image.

Figure 15:
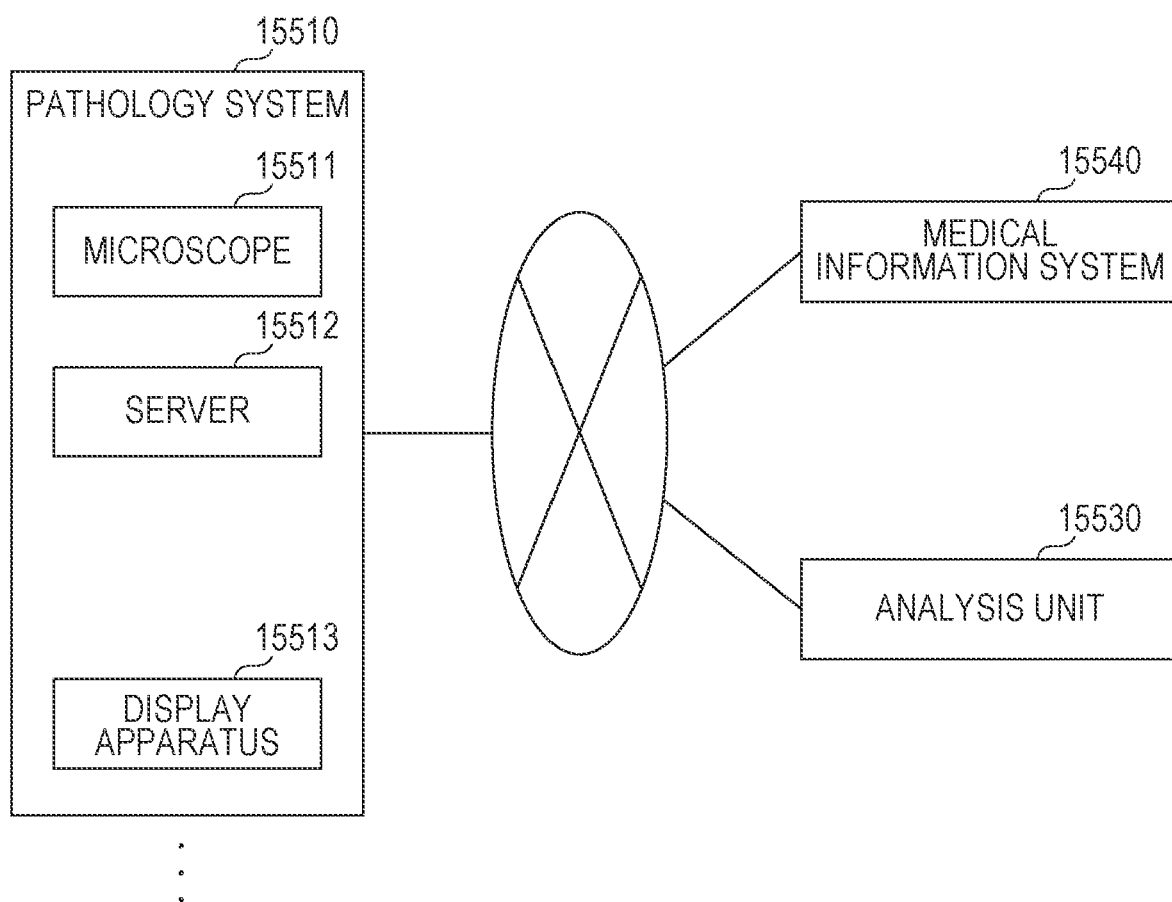
FIG. 15 is a functional block diagram of am example of a diagnosis system

As shown in FIG. 15, the system according to the present embodiment includes one or more pathology systems 15510. The system may further include an analysis unit 15530 and a medical information system 15540.

Each of one or more pathology systems 15510 is a system mainly used by a pathologist and is installed, for example, in a laboratory or a hospital. The pathology systems 15510 may be installed in different hospitals, and they are connected to the analysis unit 15530 and the medical information system 15540 via various networks such as a wide area network, a local area network, etc.

Each pathology system 15510 includes a microscope 15511, a server 15512, and a display apparatus 15513.

The microscope 15511 has a function of an optical microscope, and is used to capture an image of an observation target object placed on a glass slide thereby acquiring a pathological image in the form of a digital image. The observation target object is, for example, a tissue or a cell collected from a patient. More specifically, for example, the observation target object may be a piece of meat of an organ, saliva, blood, or the like.

The server 15512 stores the pathological image acquired by the microscope 15511 in a storage unit (not shown). When the server 15512 receives a browsing request, the server 15512 may search for a pathological image stored in the storage unit (a memory or the like) and may display the retrieved pathological image on the display apparatus 15513. The server 15512 and the display apparatus 15513 may be connected via an apparatus that controls displaying.

In a case where an observation target object is a solid substance such as a piece of meat of an organ, the observation target object may be given, for example, in the form of a stained thin section. The thin section may be prepared, for example, by slicing a block piece cut out from a sample such as an organ into the thin section. When slicing is performed, the block piece may be fixed with paraffin or the like.

The microscope 15511 may include a low-resolution imaging unit for acquiring a low-resolution image and a high-resolution imaging unit for acquiring a high-resolution image. The low-resolution imaging unit and the high-resolution imaging unit may have different optical systems or may share the same optical system. When the same optical system is used, the resolution of the microscope 15511 may be changed depending on the imaging target object.

The observation target object is disposed in a glass slide or the like and placed on a stage located within the angle of view of the microscope 15511. The microscope 15511 first acquires an overall image within the angle of view using the low-resolution imaging unit, and identifies a particular area of the observation target object from the acquired overall image. Subsequently, the microscope 15511 divides the area where the observation target object exists into a plurality of divided areas each having a predetermined size, and sequentially captures images of the respective divided areas by the high-resolution imaging unit thereby acquiring high-resolution images of the respective divided areas. Switching of the divided area to be imaged may be realized by moving the stage or the imaging optical system or both the stage and the imaging optical system. Switching between divided areas may be performed such that there is an overlap between adjacent divided areas in order to prevent an occurrence of missing some part of a divided area due to unintended sliding of the glass slide. The overall image may include identification information for associating the overall image with the patient. This identification information may be given by, for example, a character string, a QR code (registered trademark), or the like.

The high-resolution image acquired by the microscope 15511 is input to the server 15512. The server 15512 may divide each high-resolution image into smaller-size partial images. When the partial images are generated in the manner described above, the server 15512 executes a composition process for generating one image by combining a predetermined number of adjacent partial images into a single image. This compositing process can be repeated until one final partial image is produced. By performing this processing, it is possible to obtain a group of partial images in a pyramid structure in which each layer is composed of one or more partial images. In this pyramid structure, a partial image of a layer has the same number of pixels as the number of pixels of a partial image of another different layer, but the resolution is different between layers. For example, when a total of 2×2 partial images are combined to generate one partial image in an upper layer, the resolution of the partial image in the upper layer is ½ times the resolution of the partial images in a lower layer used for the composition.

By constructing a partial image group in the pyramid structure, it is possible to switch the detail level of the observation target object displayed on the display apparatus depending on the layer to which the displayed tile images belong. For example, when a lowest-level partial image is used, a small area of the observation target object is displayed in detail, while when a higher-level partial image is used, a larger area of the observation target object is displayed in a coarse manner.

The generated partial image group in the pyramid structure can be stored in, for example, a memory. When the server 15512 receives a request for acquiring a partial image together with identification information from another apparatus (for example, the analysis unit 15530), the server 15512 transmits the partial image corresponding to the identification information to this apparatus.

A partial image of a pathological image may be generated for each imaging condition such as a focal length, a staining condition, or the like. In a case where a partial image is generated for each imaging condition, partial images may be displayed such that, in addition to a specific pathological image, other pathological images which correspond to imaging conditions different from the imaging condition of the specific pathological image but correspond to the same region as that of the specific pathological image are displayed side by side. The specific imaging condition may be specified by a viewer. In a case where a plurality of imaging conditions are specified by the viewer, pathological images of the same area satisfying the respective imaging conditions may be displayed side by side.

The server 15512 may store a partial image group in the pyramid structure in a storage apparatus other than the server 15512, for example, a cloud server. Part or all of the partial image generation process described above may be executed by a cloud server or the like. By using partial images in the manner described above, a user can observe an observation target object as if the user is actually observing the observation target object while changing the observation magnification. That is, controlling the displaying provides a function of a virtual microscope. The virtual observation magnification actually corresponds to the resolution.

The medical information system 15540 is a so-called electronic medical record system. In this medical information system 15540, information is stored related to diagnosis such as patient identification information, patient disease information, test information and image information used in diagnosis, a diagnosis result, and a prescription. For example, a pathological image obtained by imaging an observation target object of a patient may be stored once in the server 15512 and may be displayed on the display apparatus 15514 later. A pathologist using the pathology system 15510 performs a pathological diagnosis based on the pathological image displayed on the display apparatus 15513. The result of the pathological diagnosis made by the pathologist is stored in the medical information system 15540.

The analysis unit 15530 is capable of analyzing the pathological image. A learning model built by machine learning may be used for the analysis. The analysis unit 15530 may derive a result of classification of a specific area, a result of a tissue identification, or the like as the analysis result. The analysis unit 15530 may further derive a result of cell identification, the number of cells, the position of cell, and luminance information, and scoring information for them. These pieces of information obtained by the analysis unit 15530 may be displayed as diagnostic support information on the display apparatus 15513 of the pathology system 15510.

The analysis unit 15530 may realized by a server system including one or more servers (including a cloud server) and/or the like. The analysis unit 15530 may be incorporated in, for example, the server 15512 in the pathology system 15510. That is, various analysis on the pathological image may be performed within the pathology system 15510.

The photoelectric conversion apparatus according to one of the embodiments may be applied suitably to, for example, the microscope 15511 among the various units. More specifically, the photoelectric conversion apparatus may be applied to the low-resolution imaging unit and/or the high-resolution imaging unit in the microscope 15511. This makes it possible to reduce the size of the low-resolution imaging unit and/or the high-resolution imaging unit, and thus it becomes possible to reduce the total size of the microscope 15511. As a result, it becomes easy to transport the microscope 15511, and thus it becomes easy to build the system or modify the system. Furthermore, by using the photoelectric conversion apparatus according to one of the embodiments described above, it becomes possible that part or all of the processes including acquiring a pathological image and other processes until analysis of the pathological image is completed can be executed on the fly by the microscope 15511, and thus it becomes possible to output accurate diagnostic support information quickly.

The techniques described above can be applied not only to the diagnosis support system but can be general applied to biological microscopes such as a confocal microscope, a fluorescence microscope, and a video microscope. The observation target object may be a biological sample such as cultured cells, a fertilized egg, or a sperm, a biomaterial such as a cell sheet or a three-dimensional cell tissue, or a living body such as a zebrafish or a mouse. In the observation, the observation target object is not limited to being placed on a glass slide, but can be stored in a well plate, a petri dish, or the like.

A moving image may be generated from still images of an observation target object acquired using a microscope. For example, a moving image may be generated from still images successively captured in a particular period, or an image sequence may be generated from still images captured at a particular interval. By generating a moving image from still images, it becomes possible to analyze, using machine learning, dynamic features of the observation target object such as beating or elongating of cancer cells, nerve cells, a myocardial tissue, a sperm, etc, movement such as migration, a division process of cultured cells or fertilized eggs, etc.

Other Embodiments

The present disclosure has been described above with reference to various embodiments. However, the present disclosure is not limited to these embodiments, and various modifications and changes are possible. The embodiments may be mutually applicable. That is, a part of one embodiment may be replaced with a part of another embodiment, or a part of one embodiment may be added to another embodiment. Part of an embodiment may be deleted.

It should be noted that the disclosure content of the present specification includes not only what is described in the present specification but also all matters that can be grasped from the present specification and the drawings attached to the present specification. The disclosure of this specification also includes a complement of the concepts described herein. That is, if there is a description in the present specification that "A is larger than B", for example, even if the description that "A is not larger than B" is omitted, the present specification states that "A is larger than B". It can be said that it discloses "not big". This is because when it is stated that "A is larger than B", it is premised that "A is not larger than B" is taken into consideration.

The technique according to the present disclosure can reduce the influence of heat and noise generated from the signal processing circuit on the pixels while suppressing an increase in the chip size of the photoelectric conversion apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-016450 filed Feb. 4, 2021, which is hereby incorporated by reference herein in its entirety.

What is claimed is:

1. A photoelectric conversion apparatus comprising:
a first substrate including a pixel array, the pixel array including an effective pixel area and a light-shielded pixel area, the effective pixel area including a plurality of effective pixels on which light is incident, the light-shielded pixel area including a plurality of light-shielded pixels; and
a second substrate including a signal processing circuit configured to perform signal processing using machine learning on a signal output from the first substrate, the second substrate being disposed on the first substrate in a multilayer structure, and
the signal processing circuit being so disposed as to overlap with the pixel array but not overlap with the light-shielded pixel area as seen in a plan view.

2. The photoelectric conversion apparatus according to claim 1, wherein
a part of the plurality of light-shielded pixels includes an optical black pixel including a light-shielded photoelectric conversion element, and
the signal processing circuit does not overlap with the optical black pixel as seen in a plan view.

3. The photoelectric conversion apparatus, according to claim 2, wherein
a part of the plurality of light-shielded pixels is a reference pixel including no photoelectric conversion element, and
the signal processing circuit does not overlap with the reference pixel as seen in a plan view.

4. The photoelectric conversion apparatus, according to claim 3, wherein
a bypass capacitor is provided on the first substrate and is connected to a first power line and a second power line, and
the signal processing circuit overlaps with the bypass capacitor as seen in a plan view.

5. The photoelectric conversion apparatus, according to claim 4, wherein
the second substrate includes a plurality of signal processing circuits, and
a part of the plurality of signal processing circuits does not overlap with the light-shielded pixel area as seen in a plan view.

6. The photoelectric conversion apparatus, according to claim 3, wherein
the second substrate includes a plurality of signal processing circuits, and
a part of the plurality of signal processing circuits does not overlap with the light-shielded pixel area as seen in a plan view.

7. The photoelectric conversion apparatus, according to claim 2, wherein
a bypass capacitor is provided on the first substrate and is connected to a first power line and a second power line, and
the signal processing circuit overlaps with the bypass capacitor as seen in a plan view.

8. The photoelectric conversion apparatus, according to claim 7, wherein
the second substrate includes a plurality of signal processing circuits, and
a part of the plurality of signal processing circuits does not overlap with the light-shielded pixel area as seen in a plan view.

9. The photoelectric conversion apparatus, according to claim 2, wherein
the second substrate includes a plurality of signal processing circuits, and
a part of the plurality of signal processing circuits does not overlap with the light-shielded pixel area as seen in a plan view.

10. The photoelectric conversion apparatus, according to claim 1, wherein
a part of the plurality of light-shielded pixels includes a reference pixel including no photoelectric conversion element, and
the signal processing circuit does not overlap with the reference pixel as seen in a plan view.

11. The photoelectric conversion apparatus, according to claim 10, wherein
a bypass capacitor is provided on the first substrate and is connected to a first power line and a second power line, and
the signal processing circuit overlaps with the bypass capacitor as seen in a plan view.

12. The photoelectric conversion apparatus, according to claim 11, wherein
the second substrate includes a plurality of signal processing circuits, and
a part of the plurality of signal processing circuits does not overlap with the light-shielded pixel area as seen in a plan view.

13. The photoelectric conversion apparatus, according to claim 10, wherein
the second substrate includes a plurality of signal processing circuits, and
a part of the plurality of signal processing circuits does not overlap with the light-shielded pixel area as seen in a plan view.

14. The photoelectric conversion apparatus, according to claim 1, wherein
a bypass capacitor is provided on the first substrate and is connected to a first power line and a second power line, and
the signal processing circuit overlaps with the bypass capacitor as seen in a plan view.

15. The photoelectric conversion apparatus, according to claim 14, wherein
the second substrate includes a plurality of signal processing circuits, and
a part of the plurality of signal processing circuits does not overlap with the light-shielded pixel area as seen in a plan view.

16. The photoelectric conversion apparatus, according to claim 1, wherein
the second substrate includes a plurality of signal processing circuits, and
a part of the plurality of signal processing circuits does not overlap with the light-shielded pixel area as seen in a plan view.

17. A photoelectric conversion system comprising:
the photoelectric conversion apparatus according to claim 1; and
a signal processing unit that generates an image using a signal output by the photoelectric conversion apparatus.

18. A mobile body, comprising:
the photoelectric conversion apparatus according to claim 1, and
a control unit that controls movement of the mobile body by using a signal output by the photoelectric conversion apparatus.

19. The photoelectric conversion apparatus, according to claim 1, wherein light is not incident on the plurality of light-shielded pixels.

* * * * *